(12) United States Patent
Ohshima

(10) Patent No.: US 6,770,916 B2
(45) Date of Patent: Aug. 3, 2004

(54) QUANTUM CIRCUIT DEVICE AND METHOD FOR QUANTUM OPERATION

(75) Inventor: Toshio Ohshima, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 129 days.

(21) Appl. No.: 10/100,073

(22) Filed: Mar. 19, 2002

(65) Prior Publication Data

US 2003/0052317 A1 Mar. 20, 2003

(30) Foreign Application Priority Data

Sep. 18, 2001 (JP) ........................................ 2001-283918

(51) Int. Cl.$^7$ ............................................. H01L 29/88
(52) U.S. Cl. ............................. 257/104; 257/9; 257/14; 257/30; 364/244; 395/800; 437/21; 437/23
(58) Field of Search ............................ 257/104, 9, 10, 257/30, 14, 17, 25; 395/800; 364/232.41, 244; 382/43; 437/21, 23, 52

(56) References Cited

U.S. PATENT DOCUMENTS

| | | | | |
|---|---|---|---|---|
| 5,291,034 A | * | 3/1994 | Allam et al. .................. | 257/17 |
| 5,663,571 A | * | 9/1997 | Ugajin ......................... | 257/17 |
| 5,880,484 A | * | 3/1999 | Park et al. .................... | 257/25 |
| 6,333,516 B1 | * | 12/2001 | Katoh et al. .................. | 257/22 |

FOREIGN PATENT DOCUMENTS

| | | | |
|---|---|---|---|
| JP | 05082773 A | | 4/1993 |
| JP | 05095103 A | * | 4/1993 |
| JP | 08070145 A | | 3/1996 |
| JP | 09082901 A | | 3/1997 |
| JP | 11213652 A | | 8/1999 |
| JP | 2001257341 A | | 9/2001 |

OTHER PUBLICATIONS

D. Deutsch, Pro. R. Soc., London, Ser. A, vol. 400 pp. 97–117 (1985).
D. Deutsch, Pro. R. Soc., London, Ser. A, vol. 425 pp. 73–90 (1989).
P.W. Shor, Proceedings of the 35$^{th}$ Annual Symposium on Foundation of Computer Science, Edited by Goldwasser (IEEE Computer Society, Los Alamitos, CA, 1994) pp. 124–134.
B.E. Kane, Nature (London) vol. 393, pp. 133–137 (1998).
A. Barenco et al., Phys. Rev. Lett., vol. 74, pp. 4083–4086, May 15, 1995.
P.W. Shor, Phys. Rev. A, vol. 52, pp. R2493–R2496, Oct., 1995.
D. Loss et al., Phys. Rev. A, vol. 57, pp. 120–126, Jan., 1998.
T. Ohshima, Phys. Rev. A, vol. 62, pp. 062316–1 to 062316–6, Dec. 2000.
A.N. Korotkov et al., Appl. Phys. Lett., vol. 74, pp. 4052–4054, Jun. 28, 1999.

* cited by examiner

*Primary Examiner*—Nathan J. Flynn
*Assistant Examiner*—Remmon R. Fordé
(74) *Attorney, Agent, or Firm*—Armstrong, Kratz, Quintos, Hanson & Brooks, LLP

(57) ABSTRACT

The quantum circuit device comprises: an asymmetrical coupled quantum dot of a main quantum dot $3a$ and an operational quantum dot $3b$ of a smaller size than the main quantum dot $3c$; an asymmetrical coupled quantum dot of a main quantum dot $3c$ arranged at a distance which does not permit to substantially tunnel from the main quantum dot $3a$, and an operation quantum dot $3d$ having a smaller size than the main quantum dot $3c$ and arranged at a distance which permits tunneling from the operational quantum dot $3b$; and a laser device for applying to the asymmetrical coupled quantum dots a laser beam of a wavelength which resonates an inter-level energy the asymmetrical coupled quantum dots. In the sleep state, electron is present at the ground state of the main quantum dot, where no exchange interaction takes place, and in an operation, the electron is transited to an excited state of the operational quantum dot, whereby the operation is made by the exchange interactions between the adjacent operational quantum dots. Thus, relatively stable operations can be made.

13 Claims, 20 Drawing Sheets

FIG. 7A
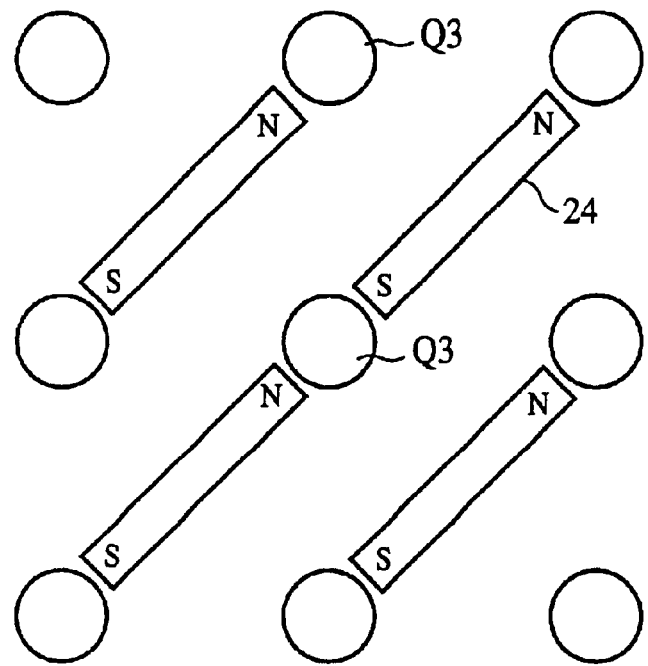
FIG. 7B
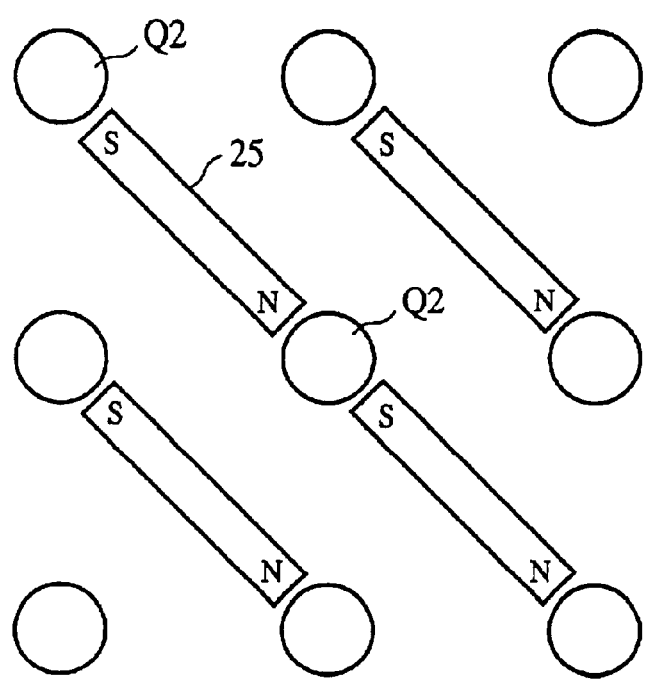
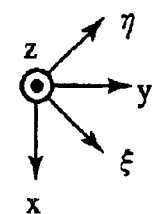

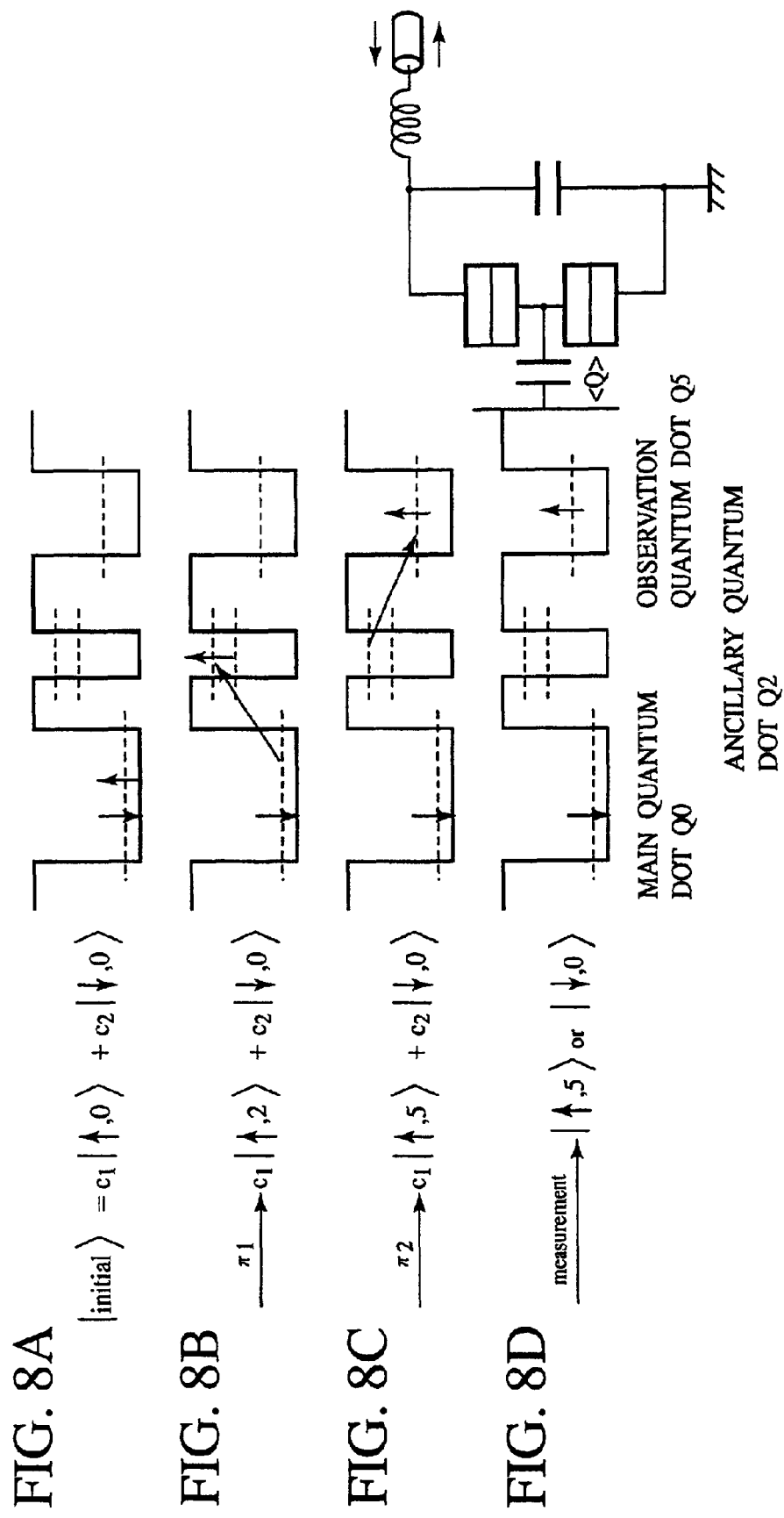

QUANTUM CIRCUIT DEVICE AND METHOD FOR QUANTUM OPERATION

BACKGROUND OF THE INVENTION

The present invention relates to a quantum circuit device for computing by using quantum dots.

The quantum computer and quantum circuit were invented by D. Deutsch (refer to, e.g., D. Deutsch, Proc. R. Soc. London, Ser. A 400, 97 (1985); 425, 73 (1989)). Thereafter, discoveries of effective quantum algorithms for factorization into prime factors, searches, etc. have induced to propose a number of physical systems. Actual operations of some of the physical systems which are circuits of merely few qubits have been confirmed. However, these systems could be integrated up to 10 qubits at most because of restrictions, as of decoherence and hardware number increase, etc. Usable operations require systems of 100 to 1000 qubits classes.

The quantum computer is never used alone, and is not operated and does not exhibit its ability without being closely connected to classic computers. This is evident when the algorism and the protocol for error corrections of, e.g., P. W. Shor (refer to, e.g., P. W. Shor, Proceedings of the 35th Annual Symposium on Foundations of Computer Science, edited by Goldwasser (IEEE Computer Society, Los Alamitos, Calif., 1994), p. 124). In consideration of the integration and the interface with the classic computer, it is preferable that the quantum computer is of course based on semiconductors.

Then, B. E. Kane proposed that the nuclear spin of P (phosphorus) which is a donor in a bulk $^{28}$Si is used as a qubit (refer to, e.g., B. E. Kane, Nature (London) 393, 133 (1998)). It is known that such nuclear spins isolated from the environment keep coherence for a very long time. However, this mode requires growth of isotope silicon crystals of high purity and control of precise location of individual impurity ions. A more realistic approach will be a semiconductor nanostructure. However, in the nanostructure as well, because of continuous state densities in structures other than the zero-dimensional structure, energy relaxation easily takes place, and accordingly this mode is difficult to realize. Fortunately today, the zero-dimensional structure, i.e., quantum dots can be formed by various methods.

In such backgrounds, A. Barenco et al. proposed qubits by using quantum dots (refer to, e.g., A. Barenco, D. Deutsch, A. Ekert, and R. Jozsa, Phys. Rev. Lett. 74, 4083 (1995)). In this mode, quantum energy levels in the quantum dot are used as 2 states of the qubit. Coulomb interactions between dipole moments of two adjacent quantum dots, which are induced by an external electric field are used in the two-qubit computation. Experimentally as well, observation of coherent quantum levels of quantum dots and control of electron numbers of quantum dots by using a single electron effect are possible. However, generally, electrons of an excited level are strongly coupled to electromagnetic environments and acoustic environments, and have strong decoherence.

The established quantum error correction and quantum fault-tolerance theories have made clear that the decoherence is tolerable to some extent (refer to P. W. Shor, Phys. Rev. A 52, R2493 (1995), etc.). However, to this end, the decoherence must be below a certain criterion. The simple quantum dot-type qubit of the mode proposed by A. Barenco have found it difficult to clear the criterion.

As means of solving the above-described problems, D. Loss and D. P. DiVincenzo have proposed a mode using a spin of electron in a quantum dot (refer to, e.g., D. Loss & D. P. DiVincenzo, Phys. Rev. A 57, 120 (1998)). Spins are expected to be less strongly coupled to environments than charges. They use, for the two-qubit operation, swap operation of coupled quantum dots in placed of the usually used controlled NOT operations. This is virtually a two-electron quantum beat; a barrier between two adjacent quantum dots is made higher and lower to permit the tunnel, whereby the beats are switched on. However, their mode has a problem in means for making the barrier between the quantum dots higher and lower. The method of switching external magnetic fields has a limit to operational speeds. No high-level processing technique for a method of applying an electric field by a micro-electrode to thereby control a potential of the barrier has been so far established.

As described above, for the quantum circuits characterized by the two-quantum level systems as operational ground states, the constitutions using quantum level or spin of electron in the two-level systems have been conventionally shown. However, the former can relatively easily make operations by using laser pulses while having high decoherence due to relaxation between the levels. On the other hand, the latter has a merit that decoherence of spins is low while control of gate operations is difficult. To be more specific with the latter, although gates must be quickly on/off to make operations precise, the use of magnetic fields makes the high speed switching very difficult. Thus, the quantum circuit devices for executing quantum operations have various problems to be solved.

SUMMARY OF THE INVENTION

An object of the present invention is to provide a quantum circuit device which can operate relatively stably at high speed.

According to one aspect of the present invention, there is provided a quantum circuit device comprising: a first asymmetrical coupled quantum dot including: a first main quantum dot; and a first operational quantum dot of a smaller size than that of the first main quantum dot, which are coupled to each other; a second asymmetrical coupled quantum dot including: a second main quantum dot arranged at a distance which does not substantially permit tunneling from the first main quantum dot; and a second operational quantum dot having a smaller size than that of the second main quantum dot and arranged at a distance which permits tunneling from the first operational quantum dot, which are coupled to each other; and a laser device for applying to the first and the second asymmetrical coupled quantum dots a laser beam of a wavelength which resonates an inter-level energy with respect to the first and the second asymmetrical coupled quantum dots.

According to another aspect of the present invention, there is provided a method of quantum operation for a quantum circuit device comprising: a first asymmetrical coupled quantum dot including: a first main quantum dot; and a first operational quantum dot of a smaller size than that of the first main quantum dot, which are coupled to each other; and a second asymmetrical coupled quantum dot including: a second main quantum dot arranged at a distance which does not substantially permit tunneling from the first main quantum dot; and a second operational quantum dot having a smaller size than that of the second main quantum dot and arranged at a distance which permits tunneling from the first operational quantum dot, which are coupled to each other, the method comprising the step of making an operation, based on a spin of an electron by using a quantum circuit having a ground state localized substantially in the first and the second main quantum dots and an excited state which is not substantially present in the first and the second main quantum dots.

As described above, according to the present invention, operational cells each comprise an symmetrical coupled quantum dot including a main quantum dot of a larger size and an operational quantum dot of a smaller size. In the sleep state, electron is present at the ground state of the main quantum dot, where no exchange interaction takes place, and in an operation, the electron is transited to an excited state of the operational quantum dot, whereby the operation is made by the exchange interactions between the adjacent operational quantum dots. Thus, relatively stable operations can be made. The electron transition between the main quantum dot and the operational quantum dot is caused by application of laser beams, which makes the constitution very easy to be fabricated.

The ancillary quantum dot is arranged adjacent to the main quantum dot and in magnetic field, whereby the one-qubit operation can be made by using the ancillary quantum dot. The observation quantum dot is arranged adjacent to the ancillary quantum dot, and based on a state of the observation quantum dot, polarization in the main quantum dot is detected by the RF-single electron transistors, whereby state of the main quantum dot can be detected at high speed.

The laser beam source for generating π pulse to be used in the electron transition is provided by a long wavelength laser, such as the quantum cascade laser, the narrow band gap semiconductor laser or others, whereby the quantum circuit device according to the present invention can make optimum achievements.

BRIEF DESCRIPTION OF THE DRAWINGS

FIGS. 7A and 7B are plan views of the quantum circuit device according to the second embodiment, which show the structure.

FIGS. 8A–8D are views explaining an observation method of Q bit states in the quantum circuit device according to the second embodiment of the present invention.

DETAILED DESCRIPTION OF THE INVENTION

[A First Embodiment]

A quantum circuit device and the method for fabricating the same according to a first embodiment of the present invention will be explained with reference to FIGS. 1, 2A–2B, 3A–3C, and 4A–4C.

Figure 1:
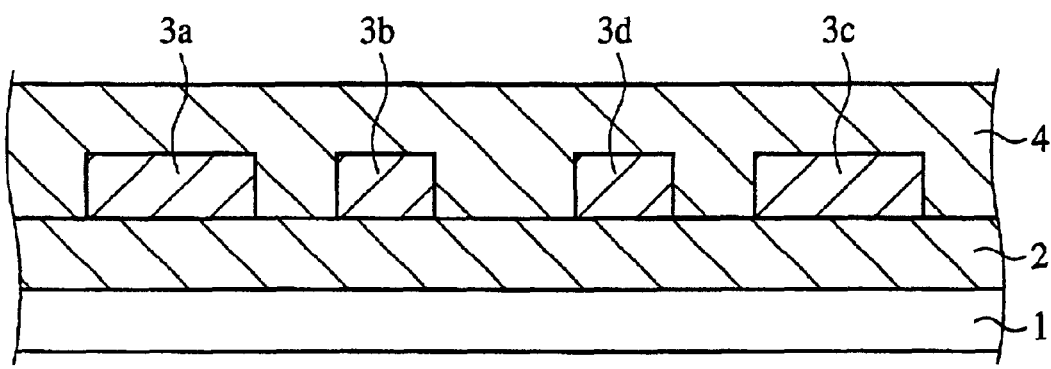
FIG. 1 is a diagrammatic sectional view of the quantum circuit device according to a first embodiment, which shows a structure thereof.
Figure 2A:
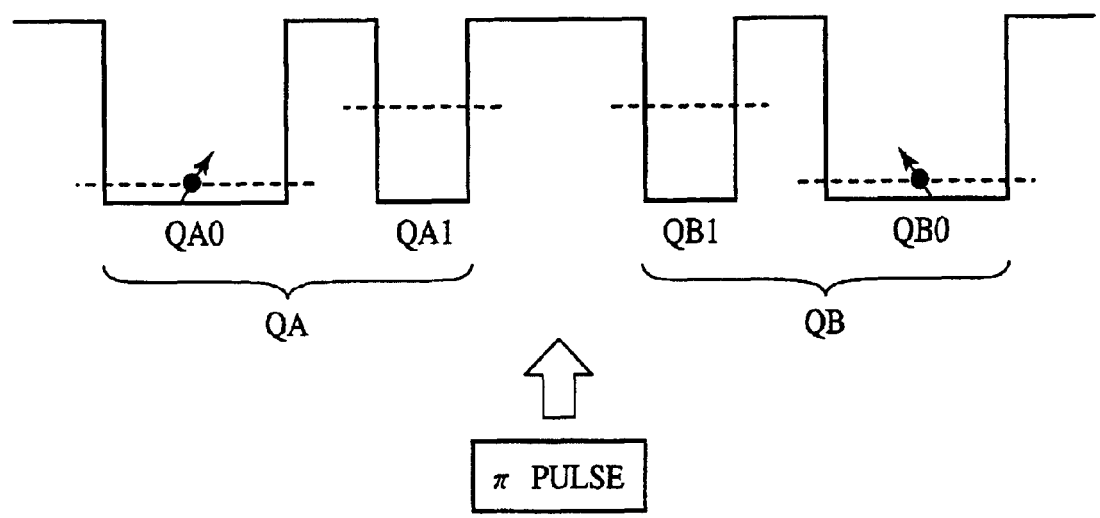
FIGS. 2A and 2B are energy band views explaining the principle and operation of the quantum circuit device according to the first embodiment of the present invention.
Figure 2B:
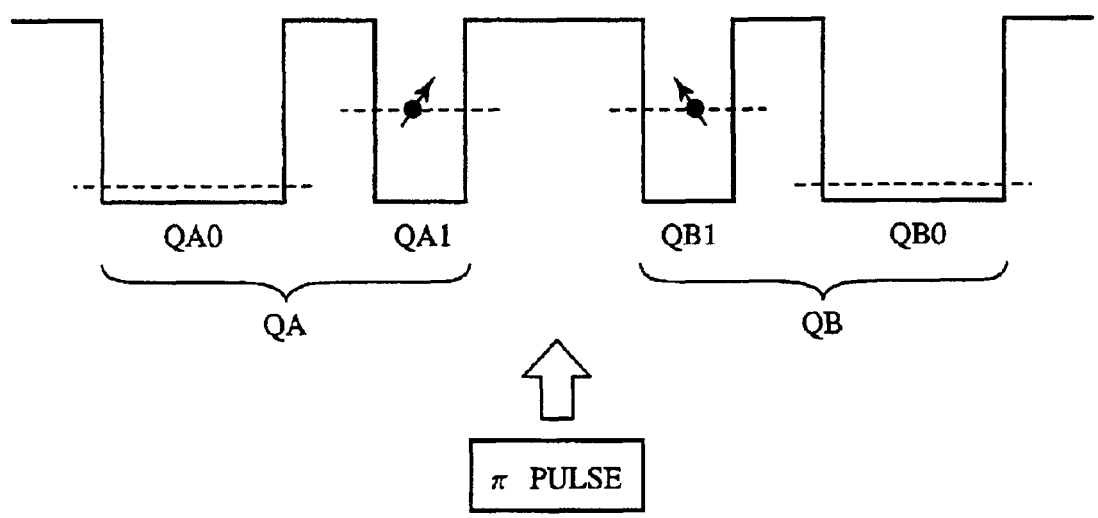
Figure 3A:
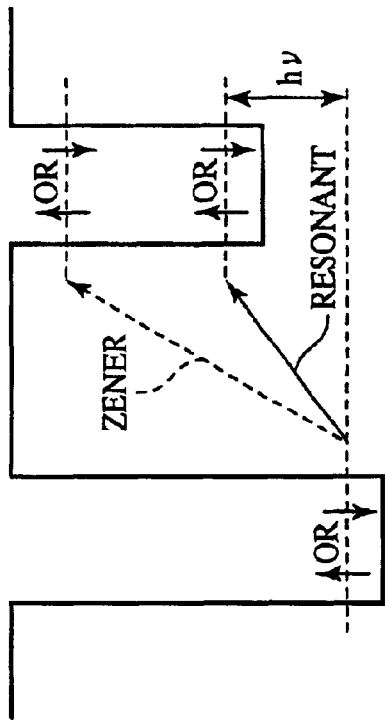
FIGS. 3A–3C are energy band views explaining beam application conditions of laser beams used in the quantum circuit device according to the present embodiment.
Figure 3B:
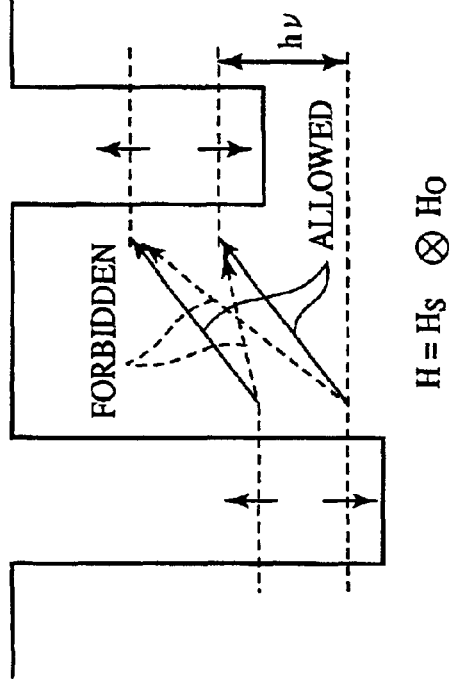
Figure 3C:
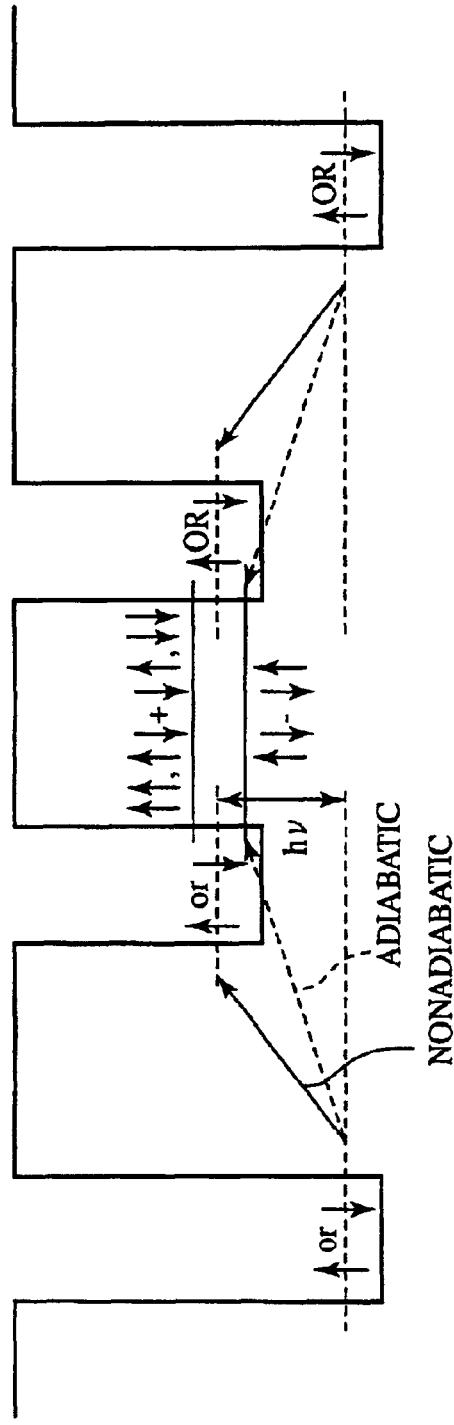
Figure 4A:
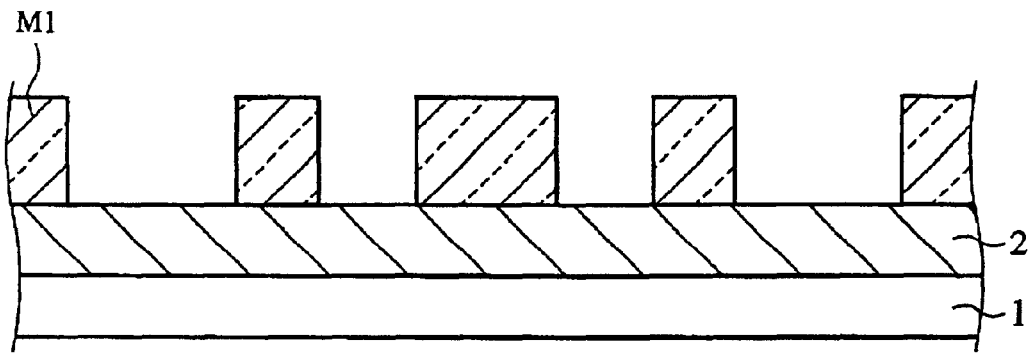
FIGS. 4A–4C are sectional views of the quantum circuit device according to the present embodiment in the steps of the method for fabricating the same, which explain the method.
Figure 4B:
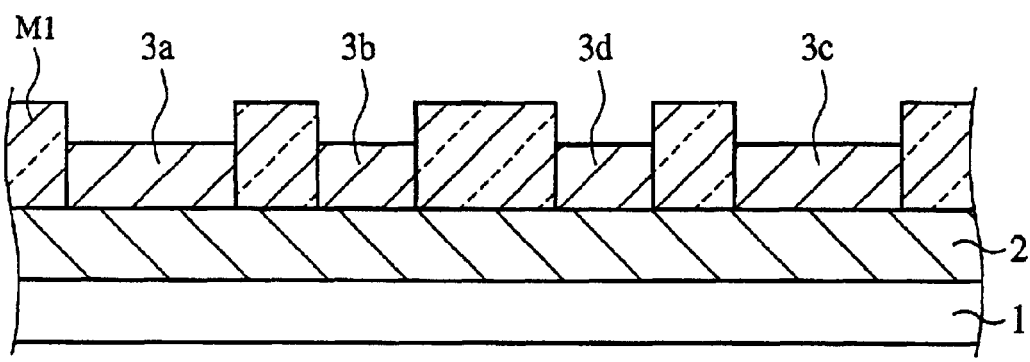
Figure 4C:
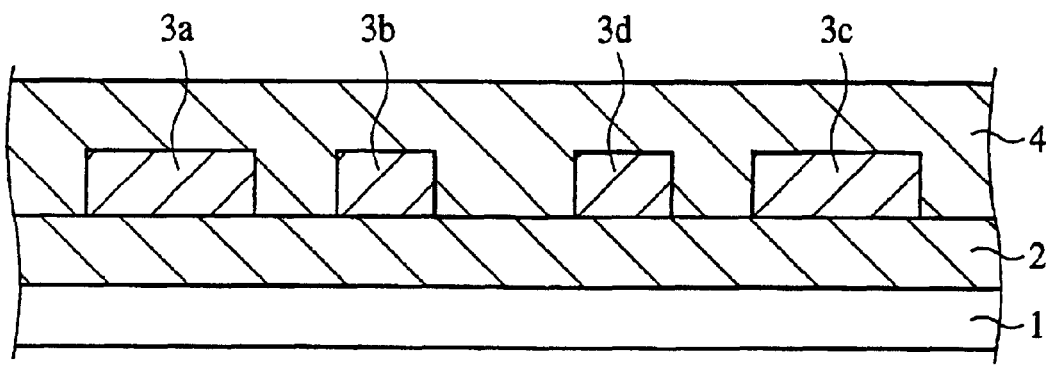

FIG. 1 is a diagrammatic sectional view of the quantum circuit device according to the present embodiment, which shows a structure thereof. FIGS. 2A and 2B are energy band diagrams explaining the principle and operation of the quantum circuit device according to the present embodiment. FIGS. 3A–3C are energy band diagrams explaining application conditions of laser beams used in the quantum circuit device according to the present embodiment. FIGS. 4A–4C are sectional views of the quantum circuit device according to the present embodiment in the steps of the method for fabricating the same, which explain the method.

First, the structure of the quantum circuit device according to the present embodiment will be explained with reference to FIG. 1.

A semiconductor layer 2 as a barrier layer is formed on a semiconductor substrate 1. Quantum dots 3a, 3b, 3c, and 3d are formed on the semiconductor layer 2 in an island-shape spaced from one another. The quantum dots 3a, 3b, 3c, and 3d are arranged respectively at a prescribed interval which will be described later. A semiconductor layer 4 as a barrier layer is formed on the semiconductor layer 2 with the quantum dots 3a, 3b, 3c, and 3d formed on.

The quantum dots 3a, 3b, and the quantum dots 3c, 3d form respective operational cells. Each operational cell includes a main quantum dot of a relatively large size (the quantum dots 3a, 3c) and an ancillary quantum dot of a relatively small size (the quantum dots 3b, 3d). In one operational cell, the main quantum dot and the ancillary quantum dot are arranged sufficiently close to each other to realize a common quantum state. Thus, each operational cell is formed of asymmetrical coupled quantum dot. "Coupled quantum dots" means that two quantum dots are arranged close to each other to have a common quantum state. "Asymmetrical coupled quantum dot" means coupled quantum dots of sizes different from each other.

The operational cells are arranged with the ancillary quantum dots (the quantum dot 3b, 3d) adjacent to each other. The ancillary quantum dots of the adjacent operational cells are spaced from each other at a distance which permits electrons to tunnel between the ancillary quantum dots.

As described above, the quantum circuit device according to the present embodiment is characterized mainly in that each operational cell is formed of the asymmetrical coupled quantum dot, and respective operational cells are spaced from each other at a distance which permits electrons to tunnel between the operational cells.

Then, the principle and operation of the quantum circuit device according to the present embodiment will be explained with reference to FIGS. 2A and 2B.

A plurality of quantum dots are arranged in a range which permits tunneling among one another, whereby a common quantum state can be realized. That is, an entire system including a plurality of quantum dots has a ground state and an excited state. Quantum dots in a system having different sizes are called a asymmetrical coupled quantum dot.

FIG. 2A is an energy band diagram. Positions are indicated horizontally, and energies are indicated vertically. An asymmetrical coupled quantum dot QA includes a main quantum dot QA0 having a relative large size and an ancillary quantum dot QA1 of a relatively small size. The two quantum dots QA0, QA1 are arranged sufficiently close to each other to realize a common quantum state. The ground state is substantially localized in the main quantum dot QA0, and an exited state is substantially localized in the ancillary quantum dot QA1.

Here, "to be substantially localized" means a state localized on a time scale of the quantum operation. It can be considered that in the ground sate an electron is present in the main quantum dot QA0, and in the excited state the electron is present in the ancillary quantum dot QA1. When a π pulse having an energy difference equal to an energy difference between the ground sate and the excited state and having an intensity and a pulse length sufficient to cause transition is applied, the electron in the ground sate transits by substantially 100% to the excited state, and the electron in the excited sate transits by substantially 100% to the ground sate.

As shown in FIG. 2A, another asymmetrical coupled quantum dot QB is arranged near the asymmetrical coupled quantum dot QA. The ancillary quantum dot QB1 of the asymmetrical coupled quantum dot QB is positioned at a distance from the ancillary quantum dot QA1 of the asymmetrical coupled quantum dot QA, which permits the tunneling. The main quantum dot QB0 of the asymmetrical coupled quantum dot QB is positioned farther from the asymmetrical coupled quantum dot QA.

In the excited state, when electrons are present in the ancillary quantum dots QA1, QB1, kinematic exchange interaction is possible between the ancillary quantum dots QA1, QB1, which are at a distance from each other, which permits tunneling. In the ground state, when electrons are present in the main quantum dots QA0, QB0, a barrier is high, and a distance between the electrons is larger. Accordingly, substantially no overlap of the wave functions, and both electrons do not interfere with each other, held or sleeping.

That is, the main quantum dots are sufficiently spaced from each other, and a barrier is high. The ancillary quantum dots are positioned at a small distance, and a barrier is low, which permits tunneling. When electrons are in the main quantum dots, no interference takes place, and interactions take place only when the electrons are in the ancillary quantum dots, whereby operations are enabled. From this view point, the ancillary quantum dots QA1, QB1 are called operational quantum dots.

FIG. 2A shows that the asymmetrical coupled quantum dots QA, QB respectively have one electron and are in the ground state. The electrons in the main quantum dots QA0, QB0 do not interfere with each other.

In this state, when a π pulse is applied to the asymmetrical coupled quantum dots QA, QB, the electrons absorb the laser beam of the π pulse and transit to the 100% excited state.

FIG. 2B shows the asymmetrical coupled quantum dots QA, QB where the electrons have transited to the excited state. Wave functions of the exited electrons are substantially localized in the operational quantum dots QA1, QB1. Spins of the electrons are not changed by the transition from the ground state to the excited state and maintain the same state.

In the excited state, kinematic (spin-spin) exchange interaction takes place between the electrons of the operational quantum dots QA1, QB1 which are positioned from each other at a distance which permit tunneling, and the spins rotate. The rotations of the spins can be used in operations.

In the electron spin qubit, kinematic exchange interaction:

$$Hs = J(S_1 \cdot S_2 - \frac{1}{4}) = (J/2)(S^2 - 2)$$

caused by, e.g., tunneling of electrons can be used in operation. Here, $S = S_1 + S_2$. This interaction is an isotropic interaction expressed by a scalar product.

As an anisotropic interaction, a vector triple product, or an inner product with a symmetrical tensor interposed:

$$He = d \cdot (S_1 \times S_2)$$

$$Ht = S_1 \cdot \Gamma \cdot S_2$$

can be also used. Here, d represents a fixed vector in space, and $\Gamma$ represents a symmetrical tensor. These interactions can be realized by using a material of strong spin-orbit interaction, e.g., a narrow band gap semiconductor, such as InAs or others.

When a π pulse is applied to the asymmetrical coupled quantum dots QA, QB in the excited state as shown in FIG. 2B. The electrons absorb the π pulse and transits from the 100% excited state to the ground state. That is, the electrons transit from the state of FIG. 2B to the state of FIG. 2A.

The electrons which have transited to the ground state of FIG. 2A after the operation, the electrons have no interaction (kinematic exchange interaction) therebetween and can stably retain the same state.

In the conventional spin quantum gate, when no operation is made, a potential barrier between two quantum dots is too high for electron to tunnel. To make an operation, the barrier is lowered by some means to enable the tunneling, whereby the exchange interaction is made possible to make a swap operation. To lower the barrier, two means are considered. In first means, a magnetic field is applied to change wave functions of the electrons in the quantum dots so that wave functions more penetrate the barrier, with a result of higher tunnel probability. However, for a significant increase of the tunnel probability, it is necessary to apply one or more magnetic fluxes of strong magnetic field to the quantum dots. In order to operate selectively a specific couple of quantum dots, a magnetic field must be local. Operations must be made nonadiabatically, and to this end a magnetic field must be quickly switched. However, it is principally difficult to satisfy these three conditions. In second means, a micronized electrode is disposed between quantum dots to apply an electric field. However, this means requires a technique for processing the much micronized electrodes.

In the means of the present invention, the two-qubit quantum operation is made by the aid of the ancillary quantum dots. Cells are each formed of a main quantum dot of a larger size and an operational quantum dot of a smaller size. Qubit is provided by a spin of one electron confined in each cell. While no operation is being made, the respective electrons in both cells are present in the associated main quantum dots, and accordingly do not tunnel because of a large distance between the electrons and a low energy levels. No exchange interaction takes place. In order to make an operation, first, $\pi$ pulse is applied to both quantum dots to transit both electrons to the associated operational quantum dots. In this sate, the electrons approach each other and can a little tunnel. Accordingly, exchange interaction take place, and a swap operation is made. Thus, very simply, the mode of the present invention requires only laser pulses to switch operations. Furthermore, laser light can be restricted to a beam of an about 1 $\mu$m-diameter which permits operations between specific cells to be switched. If necessary, cells which are within one laser spot are designed to have a resonance energy offset, whereby cells can be arranged in high density.

To realize the electron transition described above, an intensity of the laser beam used in the transition of the electrons must be set in a range where the laser beam is not excessively intense or excessively weak.

FIGS. 3A and 3B are energy band diagrams explaining problems with the application of an excessively intense laser beam. FIG. 3C is an energy band diagram explaining problems with the application of an excessively weak laser beam. In FIG. 3A, for the convenience of explanation, the upward spins and the downward spins are described on different energy level, which shows degeneracy has been solved. The upward spins and the downward spins are positioned on the same energy level and degenerate.

When the electron is caused to transit to adjacent quantum dot by the laser beam application, a direction of the spin of the electron must be retained as they are (adiabatic transition: indicated by "ALLOWED" in FIG. 3A). However, when an intensity of an applied laser beam is excessively high, a direction of the spin is often turned during a transition (nonadiabatic transition: indicated by "FORBIDDEN" in FIG. 3A). When a direction of the spin of the electron is turned, prescribed information cannot be retained. When an intensity of an applied laser beam is excessively high, as shown in FIG. 3B, the electron often transits to the excited level (nonadiabatic transition: indicated by "ZENER" in FIG. 3B). Accordingly, it is preferable that an intensity of a laser beam to be applied is set at an energy which does not cause the above-described transition processes, e.g., an energy of not more than 100 mW.

On the other hand, the adjacent operational dots are weakly coupled. When an intensity of an applied laser beam is excessively weak, as shown in FIG. 3C, the electrons are often transited in the two-electron state to the two-electron level where the two electrons are present at two sites (adiabatic transition: indicated by "ADIABATIC" in FIG. 3C). Accordingly, an intensity of a laser beam to be applied is preferably set at an energy which does not cause the above-described transition processes, e.g., an energy of not less than 1 mW.

Then, the method for fabricating the quantum circuit device according to the present embodiment will be explained with reference to FIGS. 4A–4C.

First, a semiconductor layer 2 to be a barrier layer is grown on a semiconductor substrate 1 by, e.g., CVD method.

Next, a mask M1 of an insulation layer of a silicon oxide layer or others, having opening at positions corresponding to the quantum dots to be formed is formed (FIG. 4A).

Then, a semiconductor layer is grown in the openings by, e.g., selective CVD method under conditions for crystal growing only on the semiconductor layer 2 to form the quantum dots 3a, 3b, 3c, 3d of the semiconductor layer.

Next, the mask M1 is etched off by, e.g., wet etching (FIG. 4B).

In place of using the above-described selective growing technique, the semiconductor layer to be the quantum dots may be formed on the entire surface by, e.g., CVD method and then patterned by lithography and etching to form the quantum dots 3a, 3b, 3c, 3d.

Then, a semiconductor layer 4 to be the barrier layer is grown on the semiconductor layer 2 with the quantum dots 3a, 3b, 3c, 3d formed on, covering the quantum dots 3a, 3b, 3c, 3d (FIG. 4C)

The quantum dots and the barrier layers may define the energy levels shown in FIGS. 2A and 2B, but it is preferable to use crystals of good quality. From this viewpoint, semiconductor crystals are preferably used. Combinations of semiconductor materials forming the quantum dots/the barrier layers can be InAs/GaAs, InGaAs/GaAs, GaAs/AlGaAs, etc. In cases where these material groups are used, GaAs substrates can be used.

As described above, according to the present embodiment, the operational cell is formed of the asymmetrical coupled quantum dot, which includes the main quantum dot of a larger size and an operational quantum dot of a smaller size. In the sleep state, the electron is present at the ground state of the main quantum dot where no exchange interaction takes place, and when an operation is made, the electron is caused to transit the excited state of the operational quantum dot so as to carry out the operation by the exchange interaction between the adjacent operational quantum dots, whereby relatively stable operation is possible. The transition of the electron between the main quantum dot and the operational quantum dot is caused by the application of laser beams, which can make the constitution for the application easy.

[A Second Embodiment]

The quantum circuit device and the method for fabricating the same according to a second embodiment of the present invention will be explained with reference to FIGS. 5, 6A–6B, 7A–7B, 8A–8D, 9A–9E, 10A–10D, 11A–11C, 12A–12B, 13A–13B, 14A–14B, 15A–15B, and 16A–16B.

Figure 5:
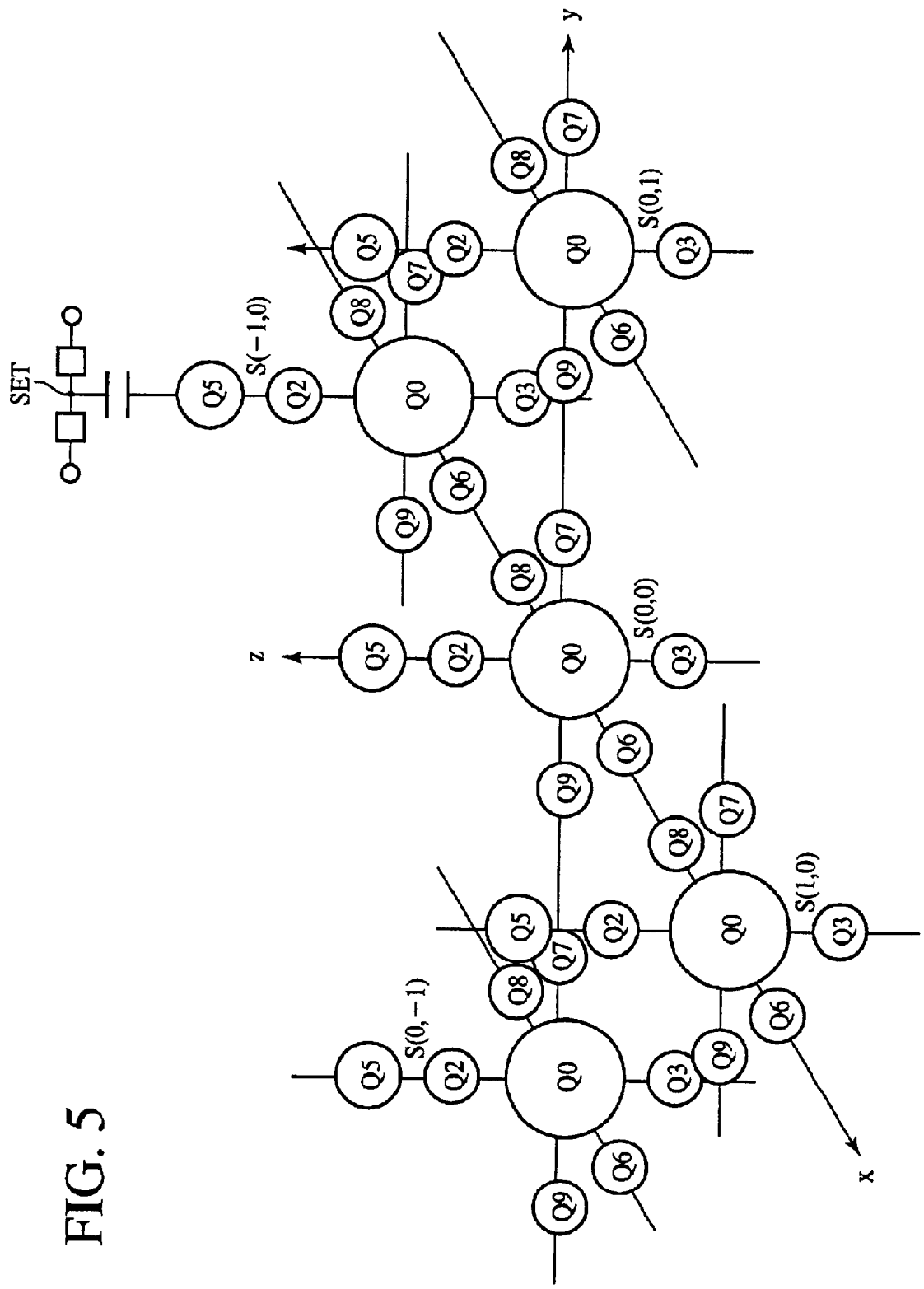
FIG. 5 is a diagrammatic perspective view of the quantum circuit device according to a second embodiment of the present invention, which shows a structure thereof.
Figure 6A:
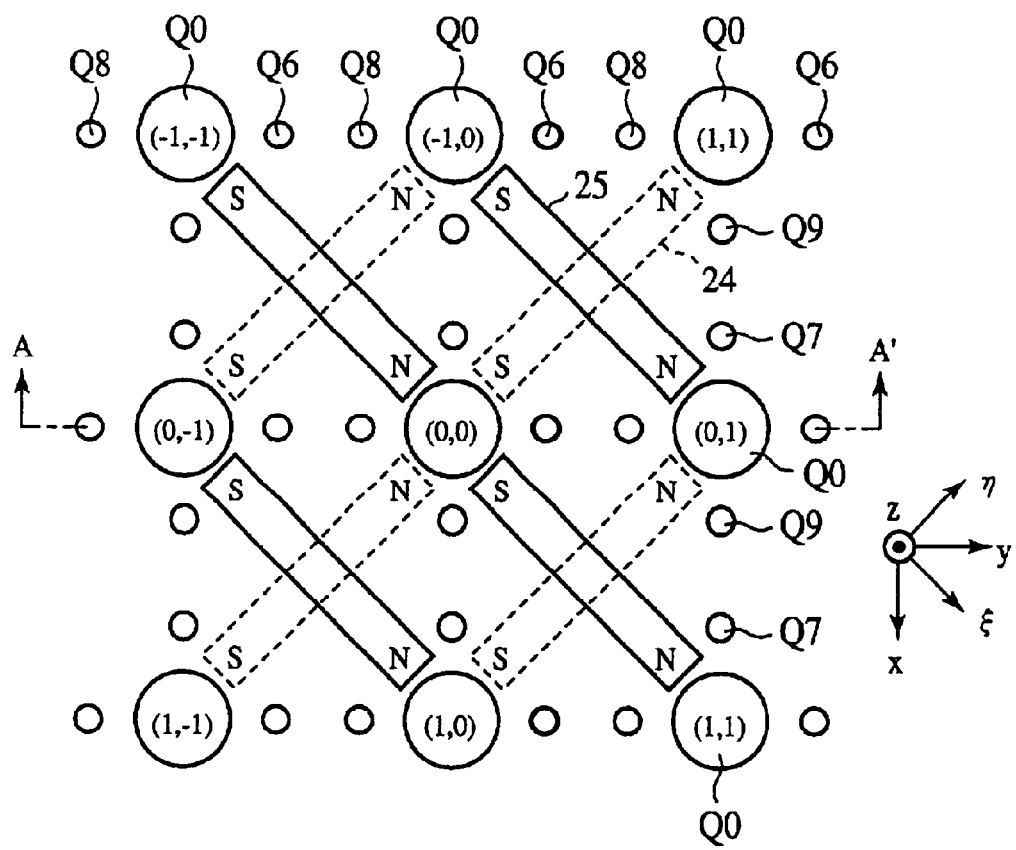
FIG. 6A is a plan view of the quantum circuit device according to the second embodiment of the present invention, which shows the structure.
Figure 6B:
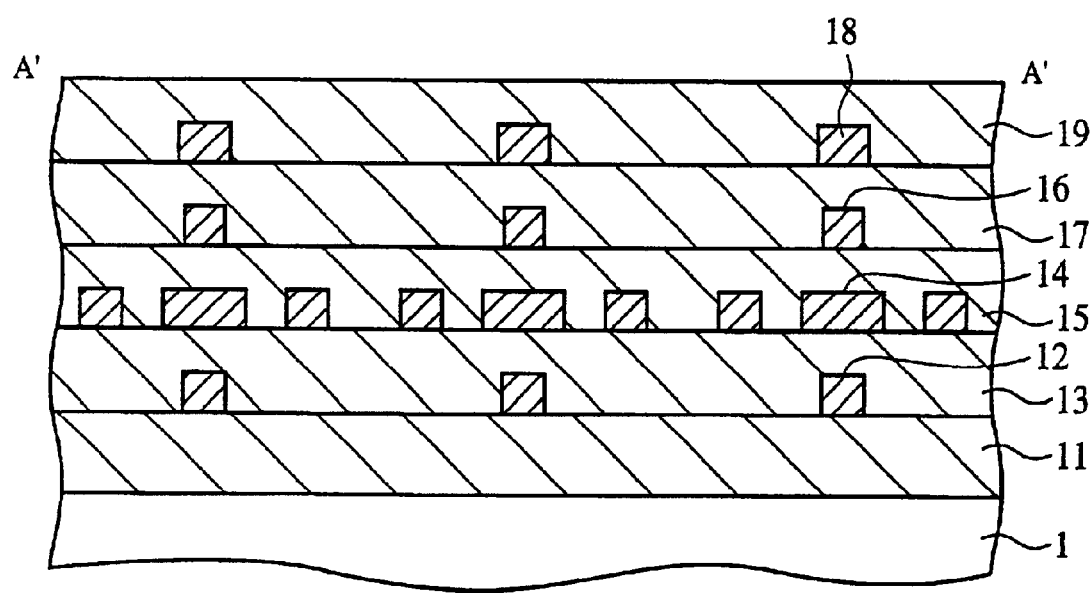
FIG. 6B is a diagrammatic sectional view of the quantum circuit device according to the second embodiment of the present invention, which shows the structure.

FIG. 5 is a diagrammatic perspective view of the quantum circuit device according to the present embodiment. FIG. 6A is a plan view of the quantum circuit device according to the present embodiment, which shows a structure thereof. FIG. 6B is a diagrammatic sectional view of the quantum circuit device according to the present embodiment, which shows the structure thereof. FIGS. 7A–7B are plan views of the quantum circuit device according to the present embodiment, which show the structure thereof. FIGS. 8A–8B are views explaining a method observing the states of the qubits of the quantum circuit device according to the present embodiment. FIGS. 9A–9E are views explaining a method of removing noises by relaxation in the quantum circuit device according to the present embodiment. FIGS. 10A–10D, 11A–11C, and 12A–12B are sectional views of the quantum circuit device according to the present embodiment in the steps of the method for fabricating the same, which explain the method. FIGS. 13A–13B, 14A–14B, 15A–15B, and 16A–16B are plan views of the quantum circuit device according to the present embodiment in the steps of the method for fabricating the same, which explain the method.

First, the structure of the quantum circuit device according to the present embodiment will be explained with reference to FIGS. 5, 6A–6B, and 7A–7B.

In the first embodiment, the quantum circuit device for making the two-qubit operation by two asymmetrical coupled quantum dots disposed adjacent to each other was shown. However, to make the quantum circuit universal, arbitrary unitary transformations of one qubit is required in addition to the two-qubit operation. The quantum circuit device according to the present embodiment can perform the arbitrary unitary transformation of one qubit.

In the electron spin qubit, an arbitrary rotation of a direction of a spin corresponds to the arbitrary unitary transformation of one qubit. A spin is accompanied by a magnetic moment. Accordingly, a spin has a precession in a uniform magnetic field. An Electron is arranged in a magnetic field, whereby one-qubit operation, which is a unitary transformation, can be made. Then, the quantum circuit device according to the present embodiment comprises the other ancillary quantum dots forming asymmetrical coupled quantum dots together with main quantum dot.

FIG. 5 is a diagrammatic perspective view of the quantum circuit device according to the present embodiment, which shows the structure thereof. A y axis is arranged transversely in FIG. 5, and the z axis is vertically arranged. An x axis perpendicularly crosses the y axis and the z axis. Operational cells S are arranged in a square matrix in the x-y plane. The respective operational cells S are represented by, e.g., S(0,0), S(0,1) corresponding to the positions. In each operational cell S, a main quantum dot Q0 is disposed at the center, operational quantum dots Q6, Q8 are arranged adjacent to the main quantum dot Q0 in the x axial direction, and operational quantum dots Q7, Q9 are arranged adjacent to the main quantum dot Q0 in the y axial direction.

An ancillary quantum dot Q3 for making unitary transformation is arranged adjacently below the main quantum dot Q0, and an ancillary quantum dot Q2 for making unitary transformation is arranged adjacently above the main quantum dot Q0. In order to realize arbitrary rotations, two or more rotary axises are necessary. The ancillary quantum dots Q2, Q3 are arranged in magnetic fields oriented in different direction so as to realize together arbitrary rotations.

Furthermore, above the ancillary quantum dot Q2, a reading quantum dot Q5 is arranged. The reading quantum dot Q5 has a larger size than the unitary transformation ancillary quantum dot Q2. An electron present in the ancillary quantum dot Q2 in the excited state are caused to transit to the reading quantum dot Q5 by the application of a n pulse. The reading quantum dot Q5 may be arranged near the other ancillary quantum dot Q3.

The reading quantum dot Q5 is connected to a single electron transistor SET. That is, when an electron is present in the reading quantum dots Q5, a charge of the electron can be detected by the single electron transistor SET.

In the arrangement shown in FIG. 5, an operation is made by adjacent arbitrary operational cells S, and an operational result can be read by the single electron transistor SET.

Then, a specific structure for realizing the arrangement shown in FIG. 5 will be explained with reference to FIGS. 6A–6B and 7A–7B. FIG. 6A is a plan view of the arrangement of the quantum dots of the respective cells, and the arrangement of permanent magnets 24, 25 projected on a plane containing the main quantum dots. FIG. 6B is the sectional view along the line A–A' in FIG. 6A. FIG. 7A is a plan view of the upper surface of a semiconductor layer 11. FIG. 7B is a plan view of the upper surface of a semiconductor layer 15.

A semiconductor layer 11 is formed as a barrier layer on a semiconductor substrate 1. On the semiconductor layer 11 there are formed a plurality of quantum dots 12, and permanent magnets 24 extended in η direction. A semiconductor layer 13 as a barrier layer is formed on the semiconductor layer 11 with the quantum dots 12 formed on. A plurality of quantum dots 14 are formed on the semiconductor layer 13. A semiconductor layer 15 as a barrier layer is formed on the semiconductor layer 13 with the quantum dots 14 formed on. On the semiconductor layer 15 there are formed a plurality of quantum dots 16, and permanent magnets 25 extended in ξ direction. A semiconductor layer 17 as a barrier layer is formed on the semiconductor layer 15 with the quantum dots 16 formed on. A plurality of quantum dots 18 are formed on the semiconductor layer 17. A semiconductor layer 19 as a barrier layer is formed on the semiconductor layer 15 with the quantum dots 18 formed on.

The quantum dots 12 formed on the semiconductor layer 11 constitute the ancillary quantum dots Q3 for unitary transformation. The permanent magnets 24 are arranged near the ancillary quantum dots Q3. As shown in FIG. 6A, the permanent magnets 24 are arranged substantially at 45° to the x axis and the y axis, and the S poles and the N poles are opposed to each other with the ancillary quantum dots Q3 interposing therebetween. That is, in FIG. 6A, a magnetic field is applied in the η direction.

The quantum dots 14 formed on the semiconductor layer 13 constitute the main quantum dots Q0 and the operational quantum dots Q6, Q7, Q8, Q9. As shown in FIG. 5B, the main quantum dots Q0 are arranged in a square matrix in the same plane. Near each main quantum dot Q0 there are arranged operational quantum dots Q6, Q8 in the x axial direction, and the operational quantum dots Q7, Q9 in the y axial direction. The main quantum dots Q0 are positioned above the ancillary quantum dots Q3.

The quantum dots 16 formed on the semiconductor layer 15 constitute the ancillary quantum dots Q2 for unitary transformation. The permanent magnets 25 are arranged near the ancillary quantum dots Q2. As shown in FIG. 6B, the S poles and the N poles are opposed to each other with the ancillary quantum dots Q2 interposing therebetween. A direction of a magnetic field to be applied to the ancillary quantum dot Q2 and a direction of a magnetic field to be applied to the ancillary quantum dot Q3 perpendicularly cross each other. That is, as shown in FIG. 6B, a magnetic field is applied in the ξ direction. The ancillary quantum dots Q2 are positioned above the main quantum dots Q0.

The quantum dots 18 formed on the semiconductor layer 17 constitute the reading quantum dots Q5. The reading quantum dots are positioned above the ancillary quantum dots Q2.

The RF-SETs (not shown) are formed on the quantum dots Q5, capacitively coupled to the quantum dots Q5.

Then, the principle and the operation of the quantum circuit device according to the present embodiment will be explained with reference to FIGS. 8A–8D and 9A–9E. The method of the two-qubit operation is the same as that of the first embodiment.

In an electron spin qubit, an arbitrary rotation of a direction of a spin corresponds to an arbitrary unitary transformation. A spin is accompanied by a magnetic moment. Accordingly, a spin has a precession in a uniform magnetic field. An electron is arranged in a magnetic field, whereby one-qubit operation, which is a unitary transformation, can be made. Then, the quantum circuit device according to the present embodiment comprises, in addition to the operational quantum dots explained with reference to FIGS. 2A and 2B, the ancillary quantum dots Q2, Q3 which form the asymmetrical coupled quantum dots together with the main quantum dots Q0, whereby the arbitrary rotation of the direction of the spin is enabled.

When the one-qubit operation is made, first an electron in the main quantum dot Q0 is caused to transit to the ancillary quantum dot Q2 or Q3. At this time, the ancillary quantum dots Q2 or Q3 is selected in accordance with a required spin direction after the operation. The electron which has transited to the ancillary quantum dot changes a spin direction in accordance with a direction of a magnetic field applied to the ancillary quantum dot. Then, the electron in the ancillary quantum dot Q2 or Q3 is caused to transit to the main quantum dot Q0, and the one-qubit operation is completed. When the electron is caused to transit between the main quantum dot and the ancillary quantum dot, $\pi$ pulse is applied.

To enable the one-qubit operation, it is necessary to generate a local magnetic field only in the ancillary quantum dots. It is effective to this end to position the ancillary quantum dots Q2, Q3 between a magnetic field of a ferromagnetic, whereby a strong magnetic field can be restricted only inside the ancillary quantum dots. Accordingly, there is no risk that an electron spin is caused under the influence of a magnetic field to turn a direction other than the ancillary quantum dots. Magnetic fields are not essentially applied in the $\eta$ direction and the $\xi$ direction and may be applied in arbitrary direction which perpendicularly cross each other, e.g., in the x direction and the y direction.

The following method can be used to observe states of respective qubits in an operation series or at the end of an operation series. For spin qubits, upward spin and downward spin are measured. To this end, the ancillary quantum dots for the one-qubit operation, and observation quantum dots are used.

Only a component of an upward spin with respect to the x axis is caused to transit to the ancillary quantum dot Q2 by the first $\pi$ pulse $(\pi_1)$ of a single color spectrum (FIGS. 8A–8B). Because of a magnetic field applied to the ancillary quantum dot, the degeneracy of the energy level has been solved by Zeeman effect, and either of an upward spin or a downward spin can be caused to transit by the application of a laser beam.

Then, the component of the upward spin caused to transit to the ancillary quantum dot Q2 is caused to transit to the observation quantum dot Q5 (FIG. 8C). The observation quantum dot Q5 is larger than the ancillary quantum dot Q2, and wave functions once distributed to the quantum dot for the observation quantum dot Q5 and the main quantum dots Q0 have existence probabilities not much influenced either by mutual interactions with outside environments.

Then, a polarized charge of the observation quantum dot Q5 is detected by a single electron transistor SET (FIG. 8D). At this time, when an electron can be detected by the single electron transistor SETs, the electron of the upward spin are present in the main quantum dots Q0, and no electron of the upward spin is present when no electron cannot be detected. Thus, states of the qubits can be observed.

In the quantum circuit device according to the present embodiment, RF-SETs are used for the detection of electrons. As shown in FIG. 8D, the RF-SETs use a high-frequency power source and have the detection circuits provided by LC circuits. The usual SET, whose band width is narrow, finds it difficult to make high-speed operation throughout the quantum circuit. However, the RF-SET, whose band width is wide, is suitable for the high-speed operation. Accordingly, it is preferable to use the RF-SETs as the SETs used in detecting electrons in the quantum circuit device. The RF-SET is detailed in, e.g., A. N. Korotkov and M. A. Paalanen, Appl. Phys. Lett., Vol. 74, 4052 (1999), etc.

The electrons present in the ancillary quantum dot is in the excited state, and may be relaxed even a little. Wave function disturbed by the relaxation become noises of quantum operation. For the prevention of such noises, the operational cells are left in a hold state longer than a set period of time.

FIG. 9 shows a method of removing noises. FIG. 9A shows the step of applying a $\pi$ pulse to the electron present in the main quantum dot to transit to the excited state.

Figure 9A:
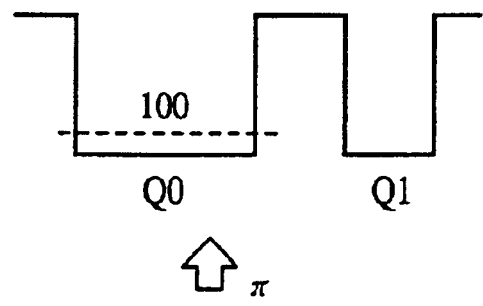
FIGS. 9A–9E are views explaining a method of removing noises due to relaxation in the quantum circuit device according to the second embodiment of the present invention.
Figure 9B:
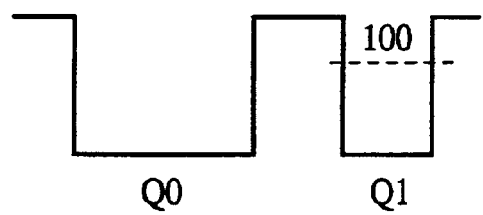

FIG. 9B shows the excited state of the electron. The electron is present in the operational quantum dot Q1 substantially 100%. However, when the electron is relaxed in this state, a certain component of the operational quantum dot Q1 returns to the main quantum dot Q0.

Figure 9C:
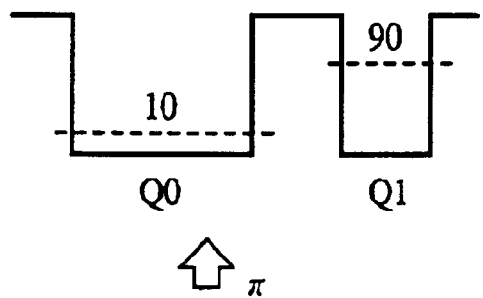

FIG. 9C shows a wave function subjected to the relaxation. The wave function is present in the operational quantum dot Q1 by 90% and transit by the rest 10% to the ground state in the main quantum dot.

When a $\pi$ pulse is applied in this state, the component of the ground state transits to the exited state, and the component of the exited state transits to the ground state.

Figure 9D:
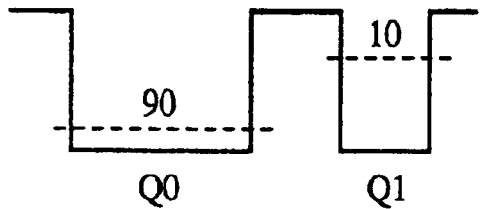

FIG. 9D shows a state after the transition. The component is present by 90% in the ground state in the main quantum dot Q0 and is present by 10% in the excited state in the operational quantum dot Q1. This state stands for a ceratin time or more.

Figure 9E:
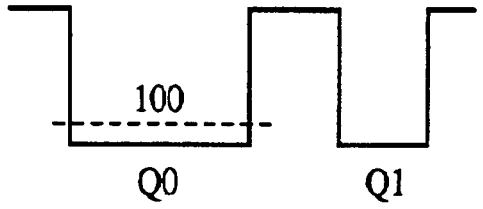

FIG. 9E shows a state after a ceratin time has passed. When the relaxation mechanism works, the component in the excited sate in the operational quantum dot Q1 transits to the ground state in the main quantum dot Q0 and transit by 100% to the ground state in the main quantum dot Q0. Thus, the noises due to the relaxation can be removed.

Next, the method for fabricating the quantum circuit device according to the present embodiment will be explained with reference to FIGS. 10A–10D, 11A–11C, 12A–12B, 13A–13B, 14A–14B, 15A–15B, and 16A–16B. FIGS. 13A–13B, 14A–14B, 15A–15B, and 16A–16B are plan views of the quantum circuit device in the steps of the method for fabricating the same, which have the constituent members projected on one plane.

First, a semiconductor layer 11 to be the barrier layer is grown on a semiconductor substrate 1 by, e.g., CVD method.

Figure 10A:
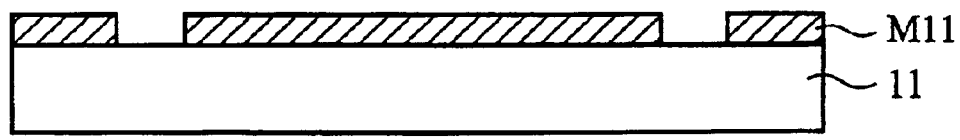
FIGS. 10A–10D, 11A–11C, and 12A–12B are sectional views of the quantum circuit device according to the second embodiment of the present invention in the steps of the method for fabricating the same, which explain the method.

Then, an insulation layer of, e.g., a silicon oxide layer is deposited on the semiconductor layer 11 by, e.g., CVD method. Then, the insulation layer is patterned by lithography and etching to form a mask M11 having openings in regions for the ancillary quantum dots Q3 to be formed in (FIG. 10A).

Then, a semiconductor layer is selectively grown by, e.g., CVD method in the openings under conditions for not permitting crystal growth on the mask M11 but permitting crystal growth only on the semiconductor layer 11 to form quantum dots 12 of the semiconductor layer.

Figure 10B:
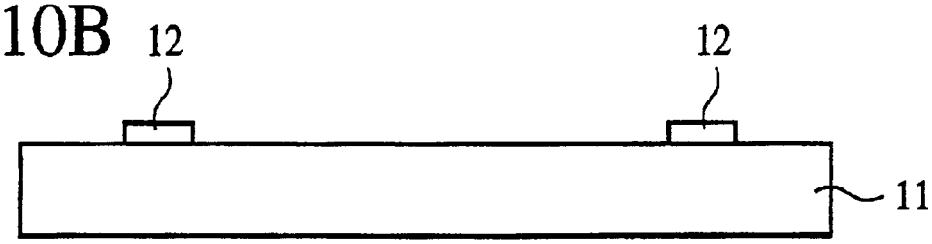

Then, the mask M11 is etched off by, e.g., wet etching (FIG. 10B).

In place of the above-described selective growing technique, a semiconductor layer to be the quantum dots may be formed on the entire surface and patterned by lithography and etching to form the quantum dots 12.

Figure 13A:
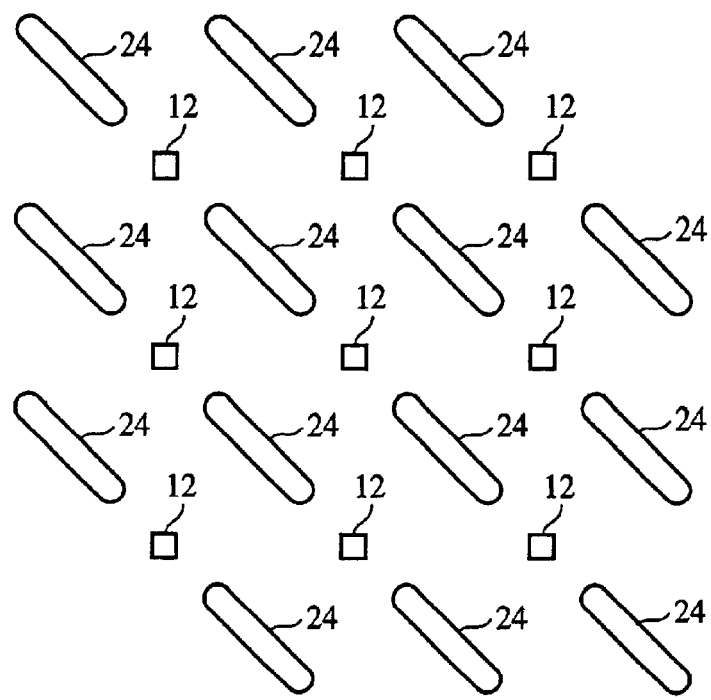
FIGS. 13A–13B, 14A–14B, 15A–15B, and 16A–16B are plan views of the quantum circuit device according to the second embodiment of the present invention in the steps of the method for fabricating the same, which explain the method.

Next, a magnetic film is deposited on the semiconductor layer 11 with the quantum dots 12 formed on and patterned to form the magnetic patterns 24 extended elongate in the η direction (FIG. 13A).

The magnetic patterns 24 may be formed by the same selective growth technique as used in forming the quantum dots 12. One of the quantum dots Q3 and the magnetic patterns 24 may be formed earlier than the other.

Then, a semiconductor layer 13 to be the barrier layer is formed on the semiconductor layer 11 with the quantum dots 12 and the magnetic patterns 24 formed on, covering the quantum dots 12 and the magnetic patterns 24.

Figure 10C:
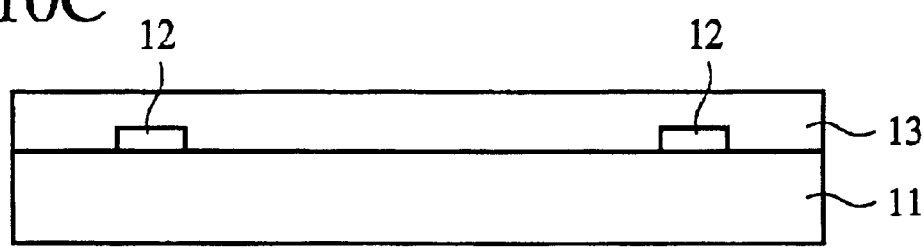
Figure 10D:
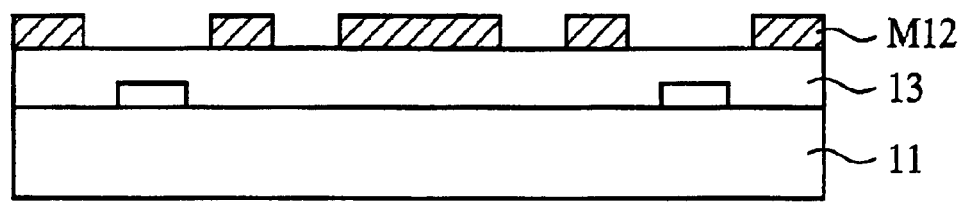

Next, an insulation layer of, e.g., a silicon oxide layer is deposited on the semiconductor layer 13 by, e.g., CVD method and then is patterned by lithography and etching to form a mask M12 having openings in regions for the main dots Q0 and the operational dots Q6, Q7, Q8, Q9 to be formed in (FIG. 10D).

Next, a semiconductor layer is selectively grown in the openings under conditions which does not permit crystal growth on the mask M12 but permits the crystal growth only on the semiconductor layer 13 to form quantum dots 14 of the semiconductor layer.

Figure 11A:
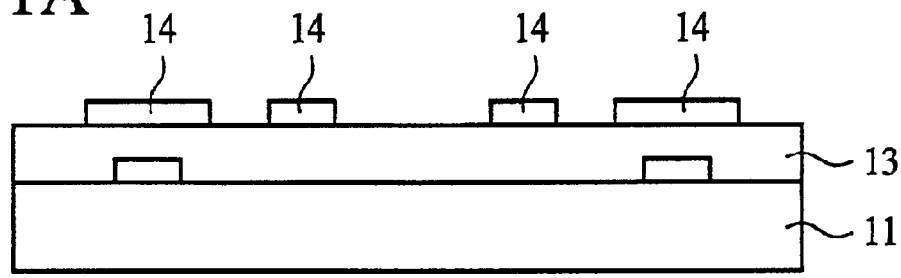
Figure 13B:
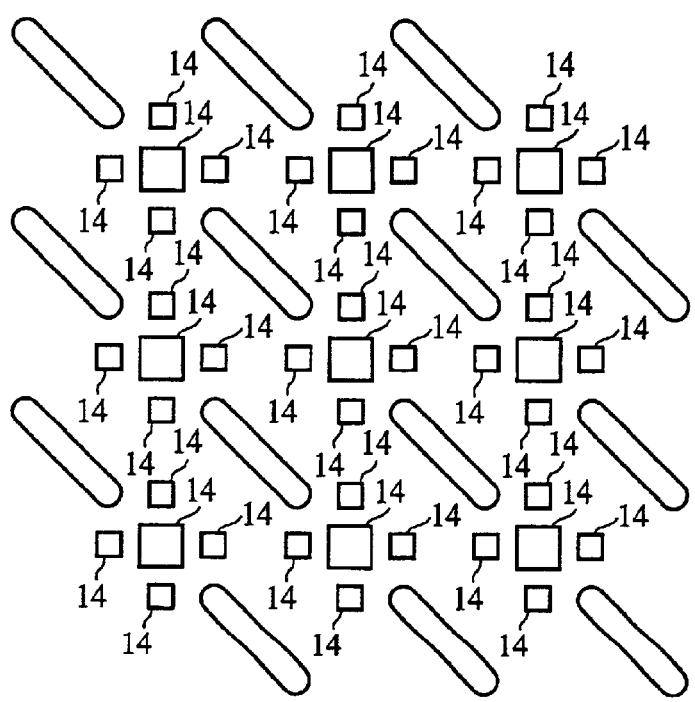

Then, the mask M12 is etched off by, e.g., wet etching (FIGS. 11A and 13B).

In place of using the above-described selective growth technique, the semiconductor layer to be the quantum dots may be formed on the entire surface and is patterned by lithography and etching to form the quantum dots 14.

Then, a semiconductor layer 15 to be the barrier layer is grown on the semiconductor layer 13 with the quantum dots 14 formed on, covering the quantum dots 14.

Figure 11B:
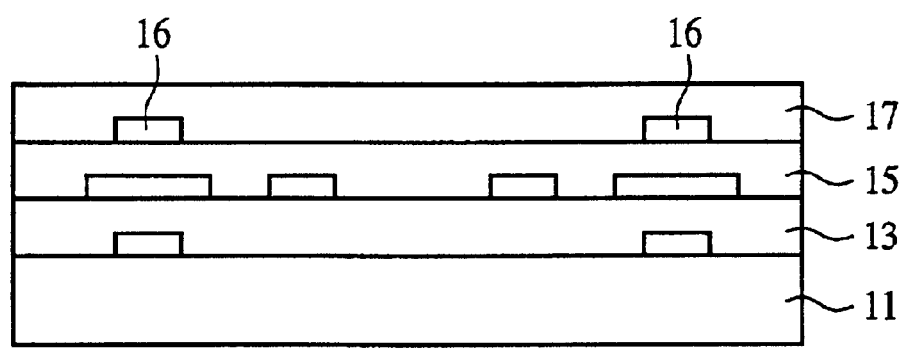
Figure 14A:
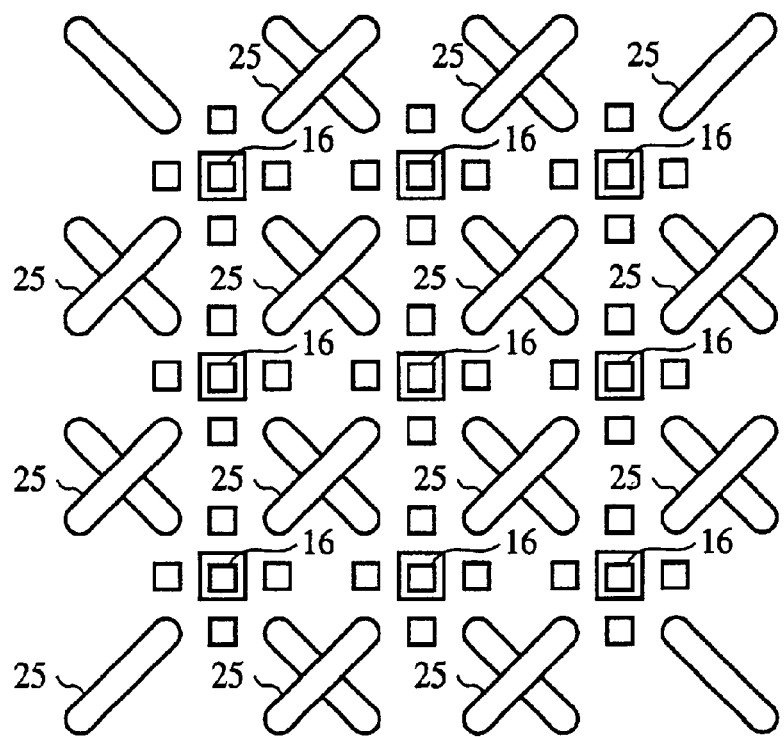

Next, in the same way as shown in FIGS. 10A to 10C, quantum dots 16 as the ancillary quantum dots Q2, magnetic patterns 25 extended elongate in the ξ direction, and a semiconductor layer 17 as a barrier layer, covering the quantum dots 16 and the magnetic patterns 25 are formed on the semiconductor layer 15 (FIG. 11B and FIG. 14A).

As shown in FIG. 7, the magnetic patterns 24, 25 are extended diagonally to the matrix of the quantum dots, which makes it unnecessary to form the quantum dots directly on the magnetic patterns. Accordingly, the magnetic patterns are thus arranged, which facilitates the fabrication.

Figure 11C:
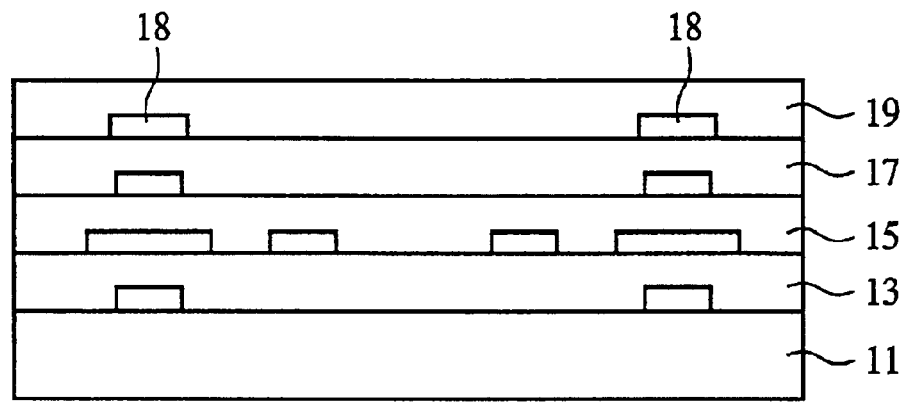

Next, in the same way as shown in FIG. 10A to FIG. 10C, quantum dots 18 as the observation quantum dots Q5, and a semiconductor layer 19 as a barrier layer covering the quantum dots 18 are formed on the semiconductor layer 17 (FIG. 11C).

Next, an insulation layer 20 of, e.g., a silicon oxide layer is formed on the semiconductor layer 19 by, e.g., CVD method.

Figure 12A:
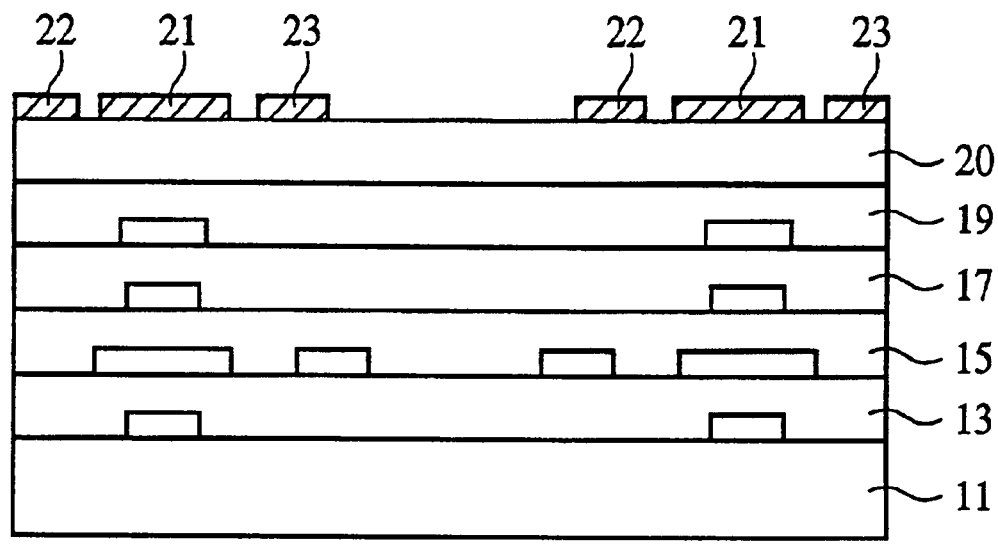
Figure 14B:
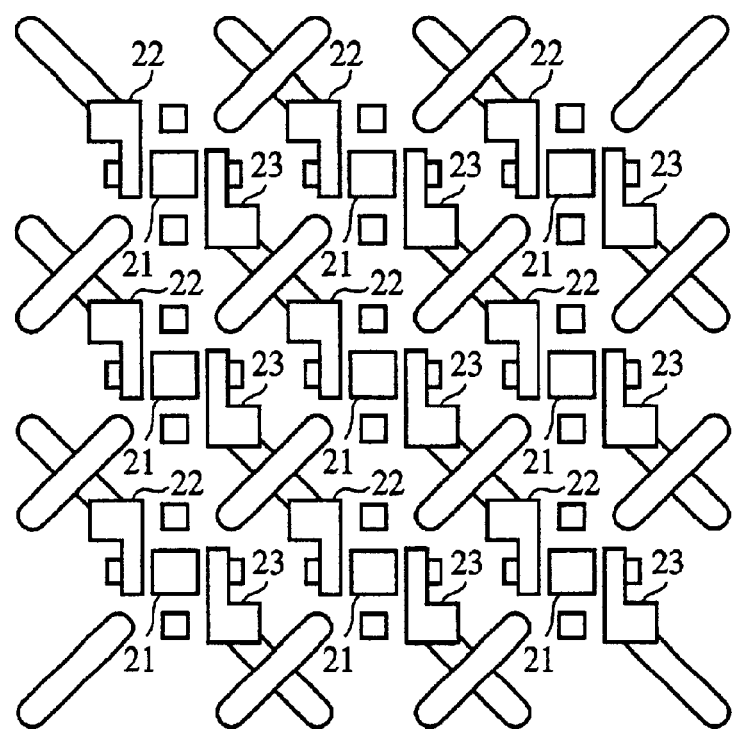

Then, a conducting layer is deposited on the insulation layer 20 by, e.g., CVD method and patterned to form the RF-SETs having the electrode 21 capacitively coupled to the quantum dots Q5 and the electrodes 22, 23 (FIG. 12A, FIG. 14B).

Next, an insulation layer 26 of, e.g., a silicon oxide layer is formed by, e.g., CVD method on the insulation layer 20 with the RF-SETs formed on.

Figure 15A:
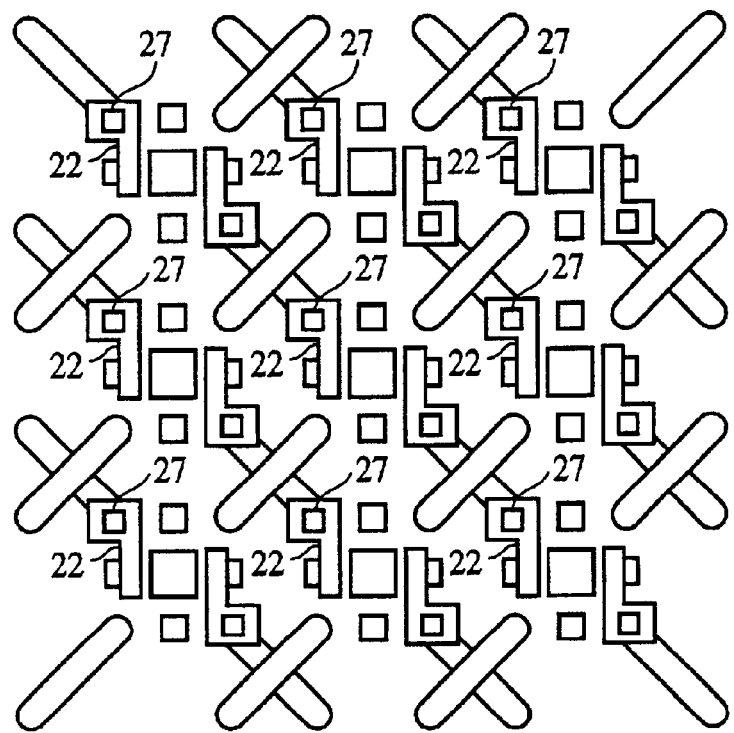

Then, the insulation layer 26 is patterned by lithography and etching to form via holes 27 down to the electrodes 22 of the RF-SETs (FIG. 15A).

Figure 15B:
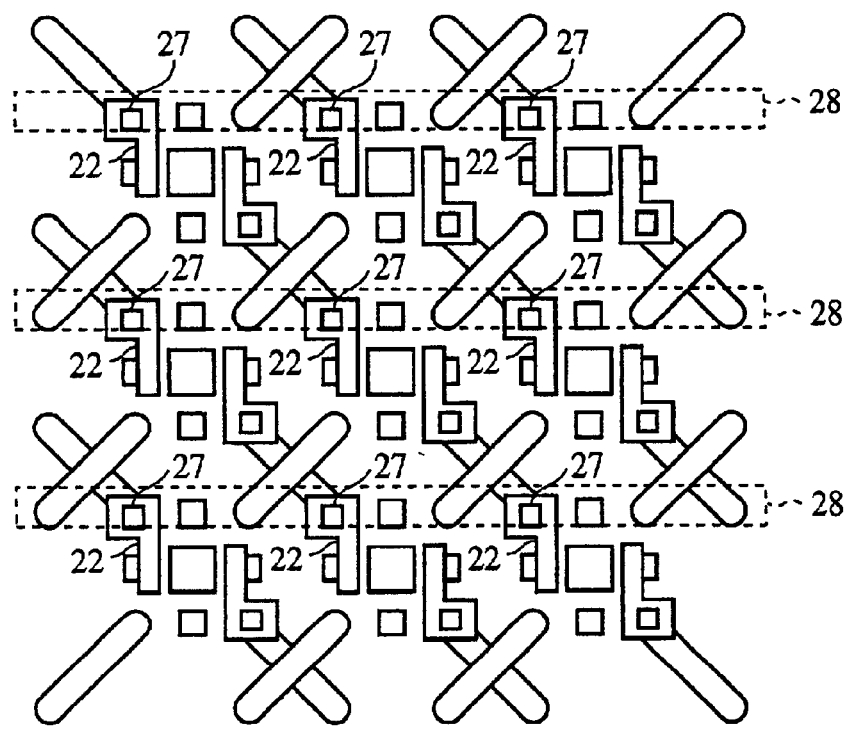

Next, an conducting layer is deposited by, e.g., sputtering method and patterned to form Vs interconnections 28 electrically connected to the electrodes 22 of the RF-SETs through the via holes 27 (FIG. 15B).

Then, an insulation layer 29 of, e.g., a silicon oxide layer is formed by, e.g., CVD method on the insulation layer 26 with the Vs interconnections 28 formed on.

Figure 16A:
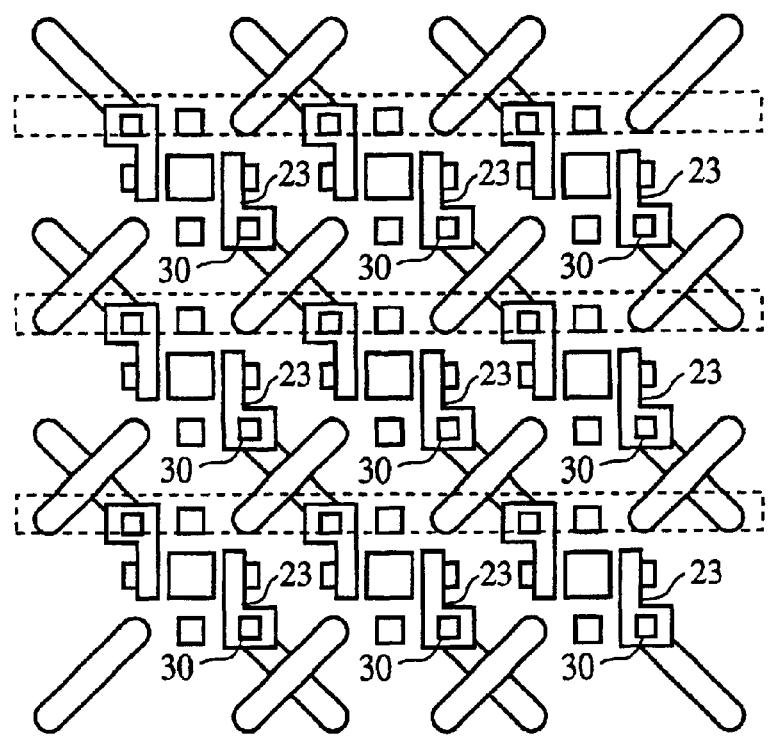
Figure 16B:
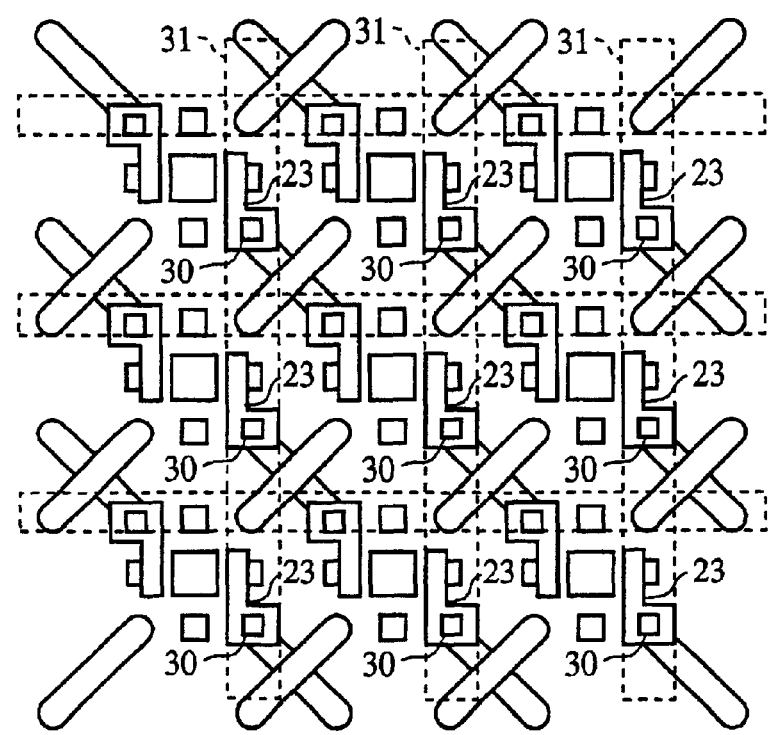

Next, the insulation layers 29, 26 are patterned by lithography and etching to form via holes 30 down to the electrodes 23 of the RF-SETs (FIG. 16A).

Figure 12B:
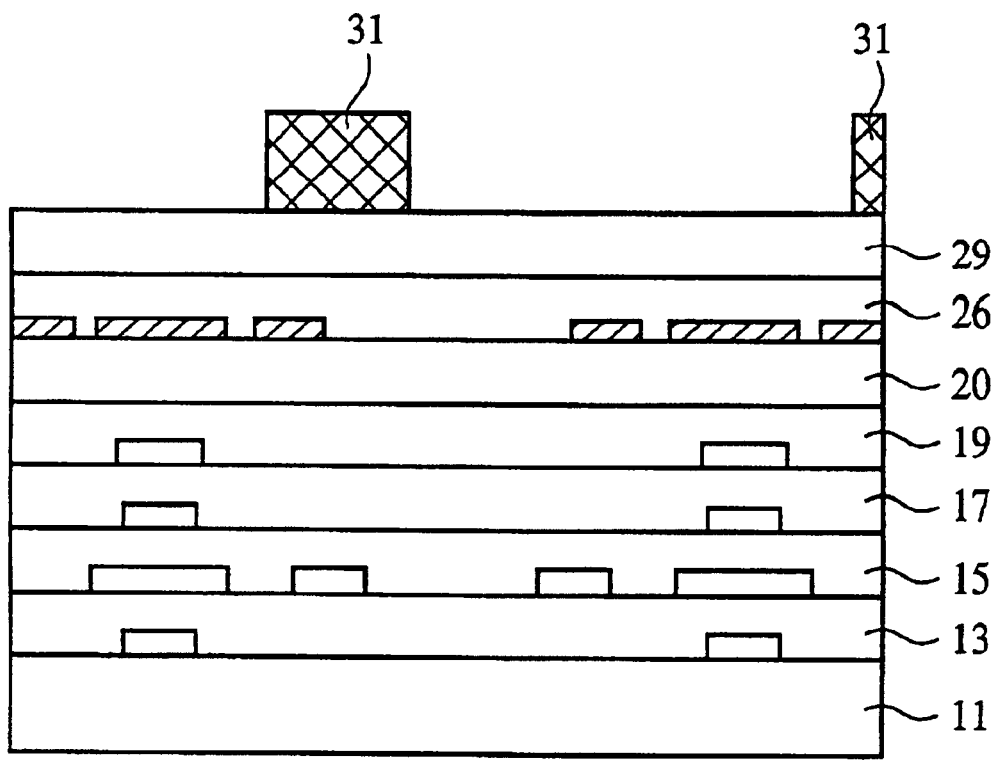

Next, a conducting layer is deposited by, e.g., sputtering method and then patterned to form Vd interconnections 31 electrically connected to the electrodes 23 of the SETs through the via holes 30 (FIG. 12B, FIG. 15B).

The magnetic patterns 24, 25 distributed on the two layers are formed, and then a magnetic field is applied in the y direction to magnetize the magnetic patterns 24, 25. Elongate magnetic patterns has a property of being magnetized in the longitudinal axes. Accordingly, with respect to the magnetic field application in the y axis, the magnetic patterns 24 are magnetized in the η direction, and the magnetic patterns 25 are magnetized in the ξ direction.

Thus, the quantum circuit device shown in FIG. 5 can be fabricated.

The quantum dots and the barrier layers may define the energy levels shown in FIGS. 2A and 2B, but it is preferable to use crystals of good quality. From this viewpoint, semiconductor crystals are preferably used. Combinations of semiconductor materials forming the quantum dots/the barrier layers can be InAs/GaAs, InGaAs/GaAs, GaAs/AlGaAs, etc. In cases where these material groups are used, GaAs substrates can be used.

In order to make the localization of a magnetic field it is preferable that the ancillary quantum dots for a magnetic field to be applied to are formed of a material of a high effective gyromagnetic ratio (g-value). From this viewpoint, Materials of high g-values are, e.g., feeble magnetic semiconductors, e.g., $Ga_xMn_{1-x}As$, etc. Accordingly, the magnetic patterns 24, 25 are preferably formed of such materials.

As described above, according to the present embodiment, the ancillary quantum dot is arranged adjacent to the main quantum dot in the magnetic field, and the one-qubit operation can be made by using the ancillary quantum dot. The observation quantum dot is arranged adjacent to the ancillary quantum dot, and polarization of the main quantum dot is detected by the RF single electron transistors, based on state of the observation quantum dot, whereby state of the main quantum dot can be detected at high speed.

[A Third Embodiment]

The quantum circuit device and the method for fabricating the same according to a third embodiment of the present invention will be explained with reference to FIG. 17.

Figure 17:
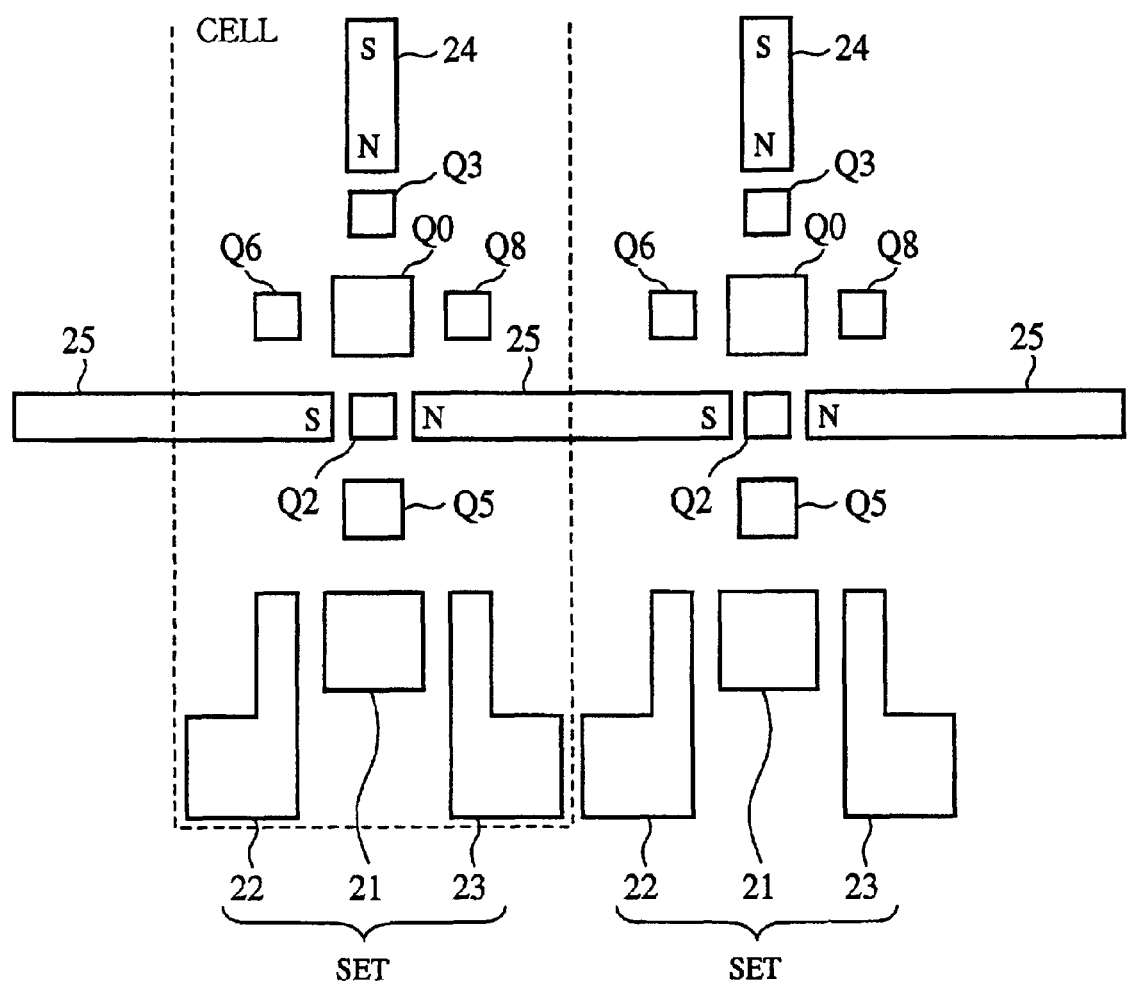
FIG. 17 is a plan view of the quantum circuit device according to a third embodiment of the present invention, which shows a structure.

FIG. 17 is a plan view of the quantum circuit device according to the present embodiment, which shows a structure thereof.

The quantum circuit device according to the second embodiment, which can make the one-qubit operation, includes the operational cells arranged in a two-dimensional matrix. However, the operational cells may be arranged in one dimension. In the arrangement of the operational cells in one dimension, two operational cells at most are adjacent to one operational cell, which lower the freedom of the two-qubit operation. However, the respective quantum dots and the respective magnetic patterns can be formed respectively by once film forming processing, which much simplifies the fabrication process.

That is, the operational cells are arranged repeatedly in one dimension (on one line), whereby as shown in FIG. 17, the ancillary quantum dots Q2, Q3, the observation quantum dots Q5 and the magnetic patterns 24, 25 can be arranged in the same plane. Accordingly, the ancillary quantum dots Q2, Q3, the observation dots Q5, the main quantum dots Q0 and the operational quantum dots Q7, Q9 can be concurrently formed. The magnetic patterns 24 and the magnetic patterns 25 can be concurrently formed.

In the pattern shown in FIG. 17, the ancillary quantum dots Q3 cannot be between the magnetic patterns 24, but the magnetic patterns 24 have the single pole sides directed to the ancillary quantum dots Q3, whereby the same effect can be provided.

As described above, according to the present embodiment, the main quantum dots, the operational quantum dots, the ancillary quantum dots and the observation quantum dots are arranged in one plane, which much facilitates the fabrication steps.

[A Fourth Embodiment]

The quantum circuit device and the method for fabricating the same according to a fourth embodiment of the present invention will be explained with reference to FIGS. 18A–18B, 19A–19B, and 20.

Figure 18A:
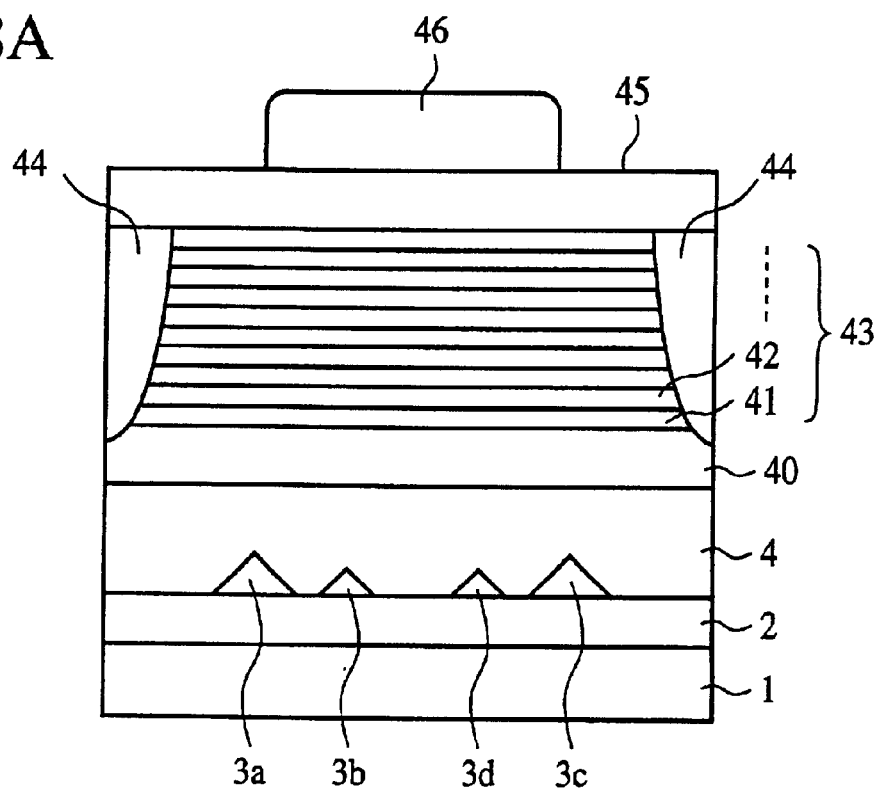
FIG. 18A is a diagrammatic sectional view of the quantum circuit device according to a fourth embodiment of the present invention, which shows a structure thereof.
Figure 18B:
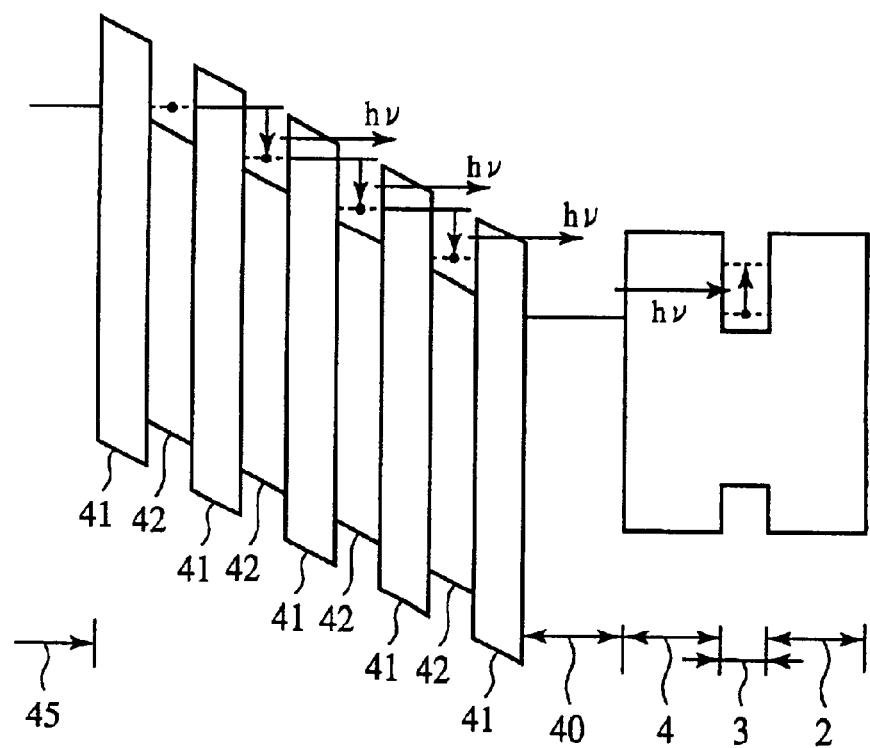
FIG. 18B is an energy band diagram of the quantum circuit device according to the fourth embodiment of the present invention, which shows a structure thereof.
Figure 19A:
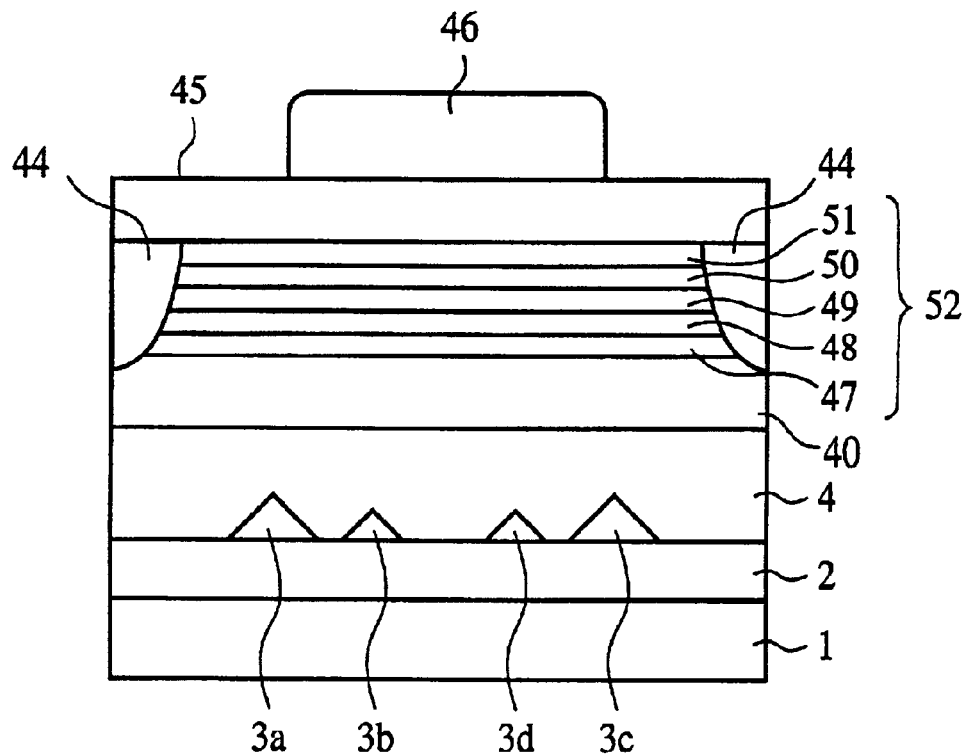
FIG. 19A is a diagrammatic sectional view of the quantum circuit device according to one modification of the fourth embodiment of the present invention, which shows a structure thereof.
Figure 19B:
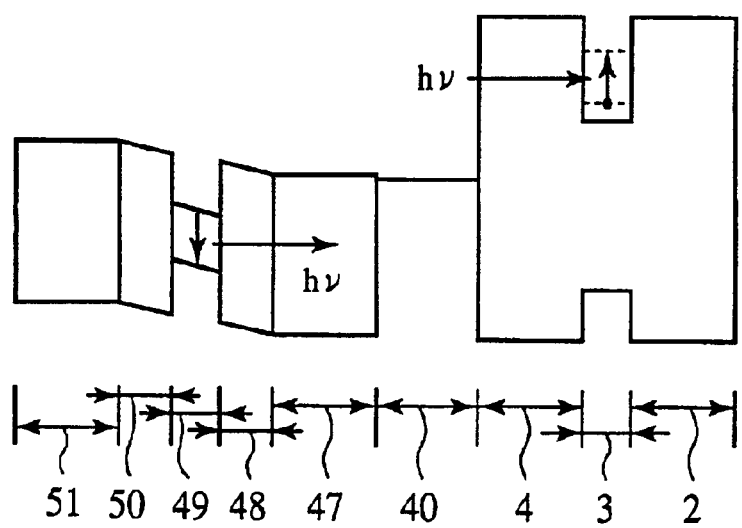
FIG. 19B is an energy band diagram of the quantum circuit device according to the modification of the fourth embodiment of the present invention, which shows a structure thereof.
Figure 20:
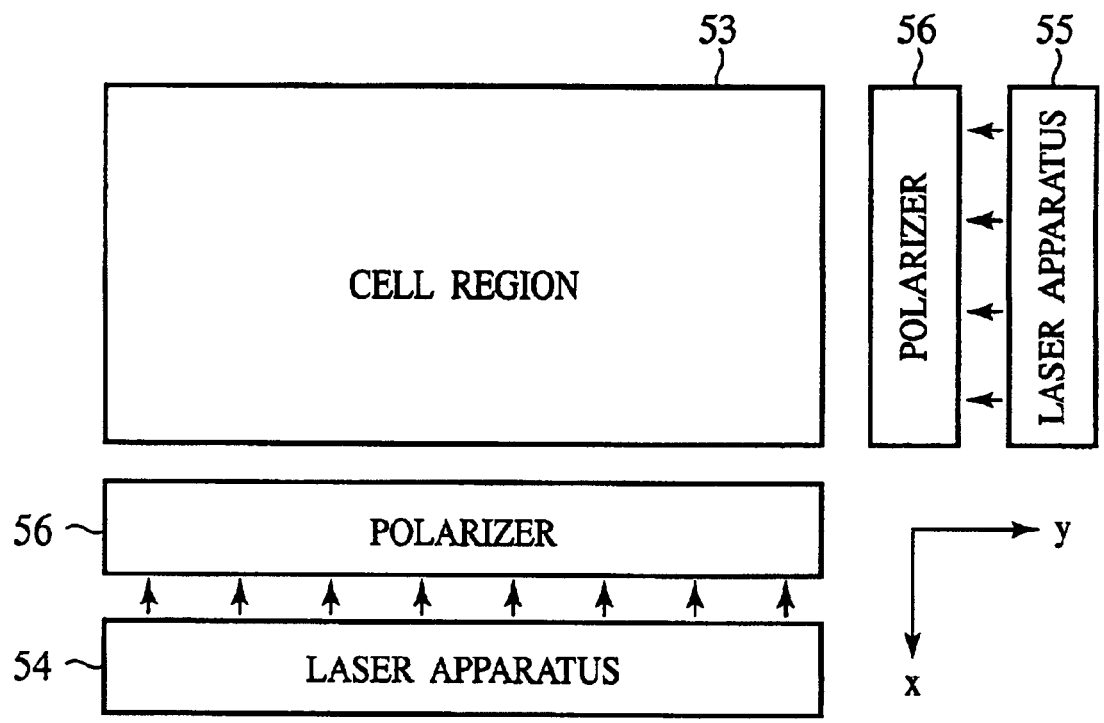
FIG. 20 is a plan view of examples of the arrangement of laser apparatuses for an arrangement of operational cells in a two-dimensional matrix.

FIG. 18A is a diagrammatic sectional view of the quantum circuit device according to the present embodiment, which shows the structure thereof. FIG. 18B is an energy band diagram of the quantum circuit device according to the present embodiment, which shows the structure thereof. FIG. 19A is a diagrammatic sectional view of the quantum circuit device according to one modification of the present embodiment, which shows the structure thereof. FIG. 19B is an energy band diagram of the quantum circuit device according to the modification of the present embodiment, which shows the structure thereof. FIG. 20 is a plan view showing an example of arrangement of a laser apparatus for the arrangement of operational cells in a two-dimensional matrix.

As described above, in the quantum circuit device according to the present invention, $\pi$ pulse is applied to the operational cell for operation and the observation of the qubits. Accordingly, a laser beam source for emitting $\pi$ pulse is essential. On the other hand, an inter-level energy of the asymmetrical coupled quantum dots is 10 s meV to 100 s meV, which does not cause resonance in the semiconductor lasers depending on the usual band-to-band transition. Then, in the present embodiment, laser beam sources and arrangement of the laser beam source suitable for the present invention will be explained.

Laser beam sources suitable for the quantum circuit device according to the present invention can be long-wavelength lasers, such as quantum cascade lasers using semiconductor superlattice, narrow-band gap semiconductor lasers, etc. The use of such long wavelengths enables the quantum circuit device according to the present invention to make optimum achievements.

FIG. 18A shows a structure in which a quantum cascade laser is laid on the quantum circuit device according to the first or the third embodiment. That is, a lower conducting layer 40 of, e.g., n-GaAs is formed on the semiconductor layer 4. On the lower conducting layer 40 there is formed a multiple quantum well formed of, e.g., a number of barrier layers 41 of, e.g., AlGaAs and well layers 42 of, e.g., GaAs laid the latter on the former. A current restriction layer 44 of, e.g., AlGaAs is provided in the multiple quantum well 43. An upper conducting layer 45 of, e.g., n-GaAs is formed on the multiple quantum well 43. An upper electrode 46 of, e.g., Au is formed on an upper conducting layer 45.

When a voltage is applied between the upper conducting layer 45 of the quantum cascade laser and the lower conducting layer 40 thereof, a energy band structure is as shown in FIG. 18B. As shown in FIG. 18B, in the quantum cascade laser, while an electron in a well layer which have tunneled to an adjacent well layer are transiting to a quantum level of the well layer (subband-to-subband transition), the electrons emit light of a wavelength hv corresponding to an energy difference from the quantum level of the adjacent well layers. In accordance with this light emitting mechanism, light of a wavelength hv is repeatedly emitted between the respective well layers of the multiple quantum well layer.

Here, an energy difference between quantum levels of adjacent well layers changes in accordance with a voltage applied between the upper conducting layer and the lower conducting layer. That is, a voltage to be applied between the upper conducting layer and the lower conducting layer is controlled, whereby a wavelength of light to be emitted by the quantum cascade laser can be easily controlled to be a wavelength which resonates an energy of 10 s–100 s meV, which is an inter-level energy of the asymmetrical coupled quantum dot.

FIG. 19A shows a structure in which a narrow band gap semiconductor laser is laid on the quantum circuit device according to the first or the third embodiment. That is, a lower conducting layer 40 of, e.g., n-GaAs is formed on the semiconductor layer 4. On the lower conducting layer 40 there is formed a device layer 52 comprising an n-type semiconductor layer 47 of, e.g., n-PbSnTe, a lower clad layer 48 of, e.g., PbSnTe, a quantum well active layer 49 of, e.g., PbSnTe, an upper clad layer 50 of, e.g., PbSnTe and a p-type semiconductor layer 51 of, e.g., p-PbSnTe which are laid one on another in the state order. A current restriction layer 44 of, e.g., PbSnTe is formed in the device layer 52. An upper conducting layer 45 of, e.g., PbSnTe is formed on the device layer 52. An upper electrode 46 of, e.g., Au is formed on the upper conducting layer 45.

In this quantum well laser, the quantum well active layer 49 can be provided by a narrow band gap semiconductor, as of III-V Group or IV-VI Group semiconductor, (e.g., PbSnTe or others), whereby the semiconductor laser can have oscillation wavelength which can resonates energy band gap between the asymmetrical coupled quantum dot.

The narrow band gap semiconductor laser cannot vary a wavelength, as can the quantum cascade laser. When excitation beams of a plurality of wavelengths are necessary, narrow band gap semiconductor lasers of different emission wavelengths are provided on the quantum circuit device in a plurality of layers.

The above-described long wavelength laser can be formed on the quantum circuit device according to the first embodiment shown in FIG. 1 by using the usual semiconductor laser fabrication process.

In all the above-described cases, the lasers are arranged in plane spaced by a ceratin distance from a plane where the operational cells are arranged, whereby arbitrary ones of the operational cells can be selectively controlled (operated, rotated, observed). The former plane may be on the side which is the same as or opposite to the plane where the SETs for the observation are arranged.

In order that the laser beams for the control effectively work, it is preferable for electric dipole transition to be intense that a plane of polarization of a laser beam is on a line interconnecting dots of the asymmetrical coupled quantum dot. Accordingly, in designing resonators of the above-described lasers, it is effective that the resonators have a structure in which a plane of polarization is substantially parallel with a direction of arrangement of the quantum dots.

The above-described lasers are arranged in plane, as are the cells. Generally, a laser has a larger physical size than quantum dot cells. Accordingly, one laser will have to take care of a plurality of cells. In such case, a polarizer, e.g., a photonic crystal for deflecting laser beams to required cells is preferably disposed between the operational cells and the laser. Thus, a small number of lasers can control operations of a number of cells. Photonic crystals are described in, e.g., Susumu Noda et al., Science, July, 2000, Alongkarn Chutinan and Susumu Noda et al., Applied Physics Letters, December, 1999, Susumu Noda et al., Journal of Lightwave Technology, November, 1999, Alongkarn Chutinan and Susumu Noda, Rapid Communications, January, 1998, etc.

In the quantum circuit device according to the second embodiment, in which the operational cells are arranged in the two-dimensional matrix, the surface (perpendicular to the z axis), where the main quantum dots Q0, the operational quantum dots Q6, Q7, Q8, Q9 are formed, is formed in plane substantially parallel with the surface where the lasers shown in FIGS. 18A and 19B are formed. A laser beam source for the electron transition between the main quantum dots and the operational quantum dots may be provided by the same laser as shown in FIG. 18 or 19, which is formed on the quantum circuit device.

However, the surface (parallel with the z axis) where the main quantum dots Q0, the ancillary quantum dots Q2, Q3, the observation quantum dots Q5 are formed is positioned perpendicular to the surfaces where the lasers shown in FIGS. 18A and 19B are formed, which makes it difficult to use the lasers in the electron transition between the main quantum dots and the ancillary quantum dots and between the ancillary quantum dots and the observation quantum dots.

Accordingly, in the quantum circuit device according to the second embodiment, as shown in FIG. 20, adjacent to a cell region 53 containing a plurality of operational cells (not shown), a laser apparatus 54 for applying laser beams along the x axis to the cell region 53, or a laser apparatus 55 for applying laser beams along the y axis to the cell region 53 may be formed. The laser apparatuses 54, 55 can be provided by the quantum cascade laser and the narrow band gap semiconductor laser shown in FIGS. 18A and 19B. The laser apparatuses 54, 55 may be used for the electron transition between the main quantum dots Q0 and the operational quantum dots Q6, Q7, Q8, Q9.

Polarizer 56, such as a photonic crystal or others, may be disposed between the cell region 53, and the laser apparatuses 54, 55, so that the laser beams can be applied to arbitrary operational cells.

As described above, according to the present embodiment, the laser beam source for generating π pulse used in the electron transition is provided by a long wavelength laser, such as the quantum cascade laser, the narrow band gap semiconductor laser or others, whereby the quantum circuit device according to the present invention can have optimum achievements.

The present invention has been explained by means of the above-described embodiments but is not limited to the above-described embodiments. For example, various modifications, improvements and combinations can be made self-explanatorily to those skilled in the art of the present invention.

What is claimed is:

1. A quantum circuit device comprising:
    a first asymmetrical coupled quantum dot including: a first main quantum dot; and a first operational quantum dot of a smaller size than that of the first main quantum dot, which are coupled to each other;
    a second asymmetrical coupled quantum dot including: a second main quantum dot arranged at a distance which does not substantially permit tunneling from the first main quantum dot; and a second operational quantum dot having a smaller size than that of the second main quantum dot and arranged at a distance which permits tunneling from the first operational quantum dot, which are coupled to each other; and
    a laser device for applying to the first and the second asymmetrical coupled quantum dots a laser beam of a wavelength which resonates an inter-level energy with respect to the first and the second asymmetrical coupled quantum dots.

2. A quantum circuit device according to claim 1, including:
    at least two coupled quantum dot pairs each having the first asymmetrical coupled quantum dot and the second asymmetrical coupled quantum dot,
    the laser device applying to a first coupled quantum dot pair or a second coupled quantum dot pair a laser beam of a wavelength which resonates an inter-level energy with respect to the first coupled quantum dot pair or the second coupled quantum dot pair,
    the first coupled quantum dot pair having an energy gap different from that of the second coupled quantum dot pair.

3. A quantum circuit device according to claim 1, further comprising:
    a first ancillary quantum dot having a smaller size than the first main quantum dot, and coupled to the first main quantum dot, forming third asymmetrical coupled quantum dot;
    a second ancillary quantum dot having a smaller size than the first main quantum dot, and coupled to the first main quantum dot, forming fourth asymmetrical coupled quantum dot;
    a first magnetic pattern arranged near the first ancillary quantum dot, for applying to the first ancillary quantum dot a magnetic field in a first direction; and
    a second magnetic pattern arranged near the second ancillary quantum dot, for applying to the second ancillary quantum dot a magnetic field in a second direction intersecting the first direction.

4. A quantum circuit device according to claim 3, further comprising:
    an observation quantum dot having a larger size than the first ancillary quantum dot, and coupled to the first ancillary quantum dot, forming fifth asymmetrical coupled quantum dot; and
    an RF single electron transistor capacitively connected to the observation quantum dot, for detecting polarization of the first main quantum dot, based on a state of the observation quantum dot.

5. A quantum circuit device according to claim 1, wherein the laser device is a quantum cascade laser.

6. A quantum circuit device according to claim 2, wherein the laser device is a quantum cascade laser, and a voltage to be applied to the quantum cascade laser is controlled to vary an oscillation wavelength to thereby select the first coupled quantum dot pair or the second coupled quantum dot pair for an electron to transit to.

7. A quantum circuit device according to claim 1, wherein the laser device is a narrow band gap semiconductor laser.

8. A quantum circuit device according to claim 2, wherein the laser device includes two narrow band gap semiconductor lasers having different oscillation wavelengths from each other, the narrow band gap semiconductor laser is exchanged to thereby select the first coupled quantum dot pair or the second coupled quantum dot pair for an electron to transit to.

9. A quantum circuit device according to claim 1, wherein a polarization plane of a laser beam emitted by the laser device is parallel with an axis interconnecting the first asymmetrical coupled quantum dot and the second asymmetrical coupled quantum dot.

10. A quantum circuit device according to claim 1, wherein an intensity of a laser beam emitted by the laser device is higher than an energy for causing transition to a two-electron level between the first and the second asymmetrical coupled quantum dots, and is lower than an energy for rotating a direction of a spin of an electron when transited or transiting an electron to an excited level of a quantum dot to be transited to.

11. A quantum circuit device according to claim 2, further comprising:

a polarizer disposed between the asymmetrical coupled quantum dots and the laser device, the asymmetrical coupled quantum dots for the laser beam to be applied to is selected by the polarizer.

12. A quantum circuit device according to claim 11, wherein the polarizer is formed of a photonic crystal.

13. A quantum circuit device according to claim 1, wherein the asymmetrical coupled quantum dots have a ground state which is localized substantially in the main quantum dots, and an excited state which is not substantially present in the main quantum dots.

* * * * *